(12) United States Patent
Okabe et al.

(10) Patent No.: US 11,957,014 B2
(45) Date of Patent: Apr. 9, 2024

(54) DISPLAY DEVICE WITH REDUCED OCCURRENCES OF ELECTROSTATIC DISCHARGE

(71) Applicant: SHARP KABUSHIKI KAISHA, Sakai (JP)

(72) Inventors: Tohru Okabe, Sakai (JP); Shinsuke Saida, Sakai (JP); Shinji Ichikawa, Sakai (JP); Hiroki Taniyama, Sakai (JP); Ryosuke Gunji, Sakai (JP); Kohji Ariga, Sakai (JP); Yoshihiro Nakada, Yonago (JP); Koji Tanimura, Yonago (JP); Yoshihiro Kohara, Yonago (JP); Hiroharu Jinmura, Yonago (JP); Akira Inoue, Yonago (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 653 days.

(21) Appl. No.: 17/264,162

(22) PCT Filed: Jul. 30, 2018

(86) PCT No.: PCT/JP2018/028486
§ 371 (c)(1),
(2) Date: Jan. 28, 2021

(87) PCT Pub. No.: WO2020/026308
PCT Pub. Date: Feb. 6, 2020

(65) Prior Publication Data
US 2021/0288129 A1    Sep. 16, 2021

(51) Int. Cl.
*H10K 59/131*    (2023.01)
*H10K 102/00*    (2023.01)
*H10K 59/12*    (2023.01)

(52) U.S. Cl.
CPC ....... *H10K 59/131* (2023.02); *H10K 59/1201* (2023.02); *H10K 2102/341* (2023.02)

(58) Field of Classification Search
CPC .......... H10K 59/131; H10K 2102/341; H10K 59/1201; G09G 2300/0804–0895
See application file for complete search history.

(56) References Cited

U.S. PATENT DOCUMENTS

| 2009/0206342 | A1 | 8/2009 | Hosoya et al. |
| 2015/0241744 | A1 | 8/2015 | Nakata et al. |
| 2017/0025441 | A1* | 1/2017 | Mori .................. H01L 27/0255 |

FOREIGN PATENT DOCUMENTS

| CN | 104704546 A | 6/2015 |
| JP | 2011-164231 A | 8/2011 |

* cited by examiner

*Primary Examiner* — Steven M Christopher
*Assistant Examiner* — Tyler J Wiegand
(74) *Attorney, Agent, or Firm* — ScienBiziP, P.C.

(57) ABSTRACT

A display device includes: a plurality of control lines; a plurality of power supply lines; a plurality of data signal lines; an oxide semiconductor layer; a first metal layer; a gate insulation film; a first inorganic insulation film; a second metal layer; a second inorganic insulation film; and a third metal layer. The oxide semiconductor layer, in a plan view, contains therein semiconductor lines formed as isolated regions between a plurality of drivers and a display area. The semiconductor lines cross the plurality of control lines and the plurality of power supply lines, are in contact with the plurality of control lines via an opening in a gate insulation film, are in contact with the plurality of power supply lines via an opening in the first inorganic insulation film, and have a plurality of narrowed portions, such that thicker and thinner regions exist along the same line.

17 Claims, 21 Drawing Sheets

DISPLAY DEVICE WITH REDUCED OCCURRENCES OF ELECTROSTATIC DISCHARGE

TECHNICAL FIELD

The disclosure relates to display devices.

BACKGROUND ART

ESD (electrostatic discharge) can occur to, for example, wiring and circuit elements in the manufacturing process of a display device. Patent Literature 1 discloses solutions to ESD.

CITATION LIST

Patent Literature

Patent Literature 1: Japanese Unexamined Patent Application Publication, Tokukai, No. 2011-164231 (Publication Date: Aug. 25, 2011)

SUMMARY

Technical Problem

The technology disclosed in Patent Literature 1 still falls short of sufficiently addressing, for example, the possibility of ESD occurring to a gate line in manufacturing steps before the gate line is electrically connected to a short ring.

Solution to Problem

The disclosure, in an aspect thereof, is directed to a display device having: a display area in which there is provided a pixel circuit; and a frame area in which there is provided a plurality of drivers, the display device including: a plurality of control lines; a plurality of power supply lines parallel to the plurality of control lines; a plurality of data signal lines crossing the plurality of control lines; an oxide semiconductor layer; a first metal layer containing the plurality of control lines therein; a gate insulation film; a first inorganic insulation film overlying the gate insulation film; a second metal layer overlying the first inorganic insulation film and containing the plurality of power supply lines therein; a second inorganic insulation film overlying the second metal layer; and a third metal layer overlying the second inorganic insulation film and containing the plurality of data signal lines therein, wherein the gate insulation film has a top face in contact with either one of the oxide semiconductor layer and the first metal layer and a bottom face in contact with another one of the oxide semiconductor layer and the first metal layer, each of the plurality of control lines is electrically connected to an associated one of the plurality of drivers via the third metal layer, the oxide semiconductor layer, in a plan view, contains therein semiconductor lines formed as islands (or isolated regions) between the plurality of drivers and the display area, and the semiconductor lines cross the plurality of control lines and the plurality of power supply lines, are in contact with the plurality of control lines via at least one opening in the gate insulation film, are in contact with the plurality of power supply lines via at least one opening in the first inorganic insulation film, and have a plurality of narrowed portions, such that there are thicker and thinner regions along the same line.

Advantageous Effects of Disclosure

The disclosure, in an aspect thereof, reduces the risk of ESD occurring to more than one control line in a first metal layer.

DESCRIPTION OF EMBODIMENTS

Throughout the following description, expressions like "component A is in the same layer as component B" indicate that components A and B are formed in the same process or step (film forming step), expressions like "component A underlies/is below component B" indicate that component A is formed in an earlier process or step than component B, and expressions like "component A overlies/is on or above component B" indicate that component A is formed in a later process or step than component B.

Figure 1:
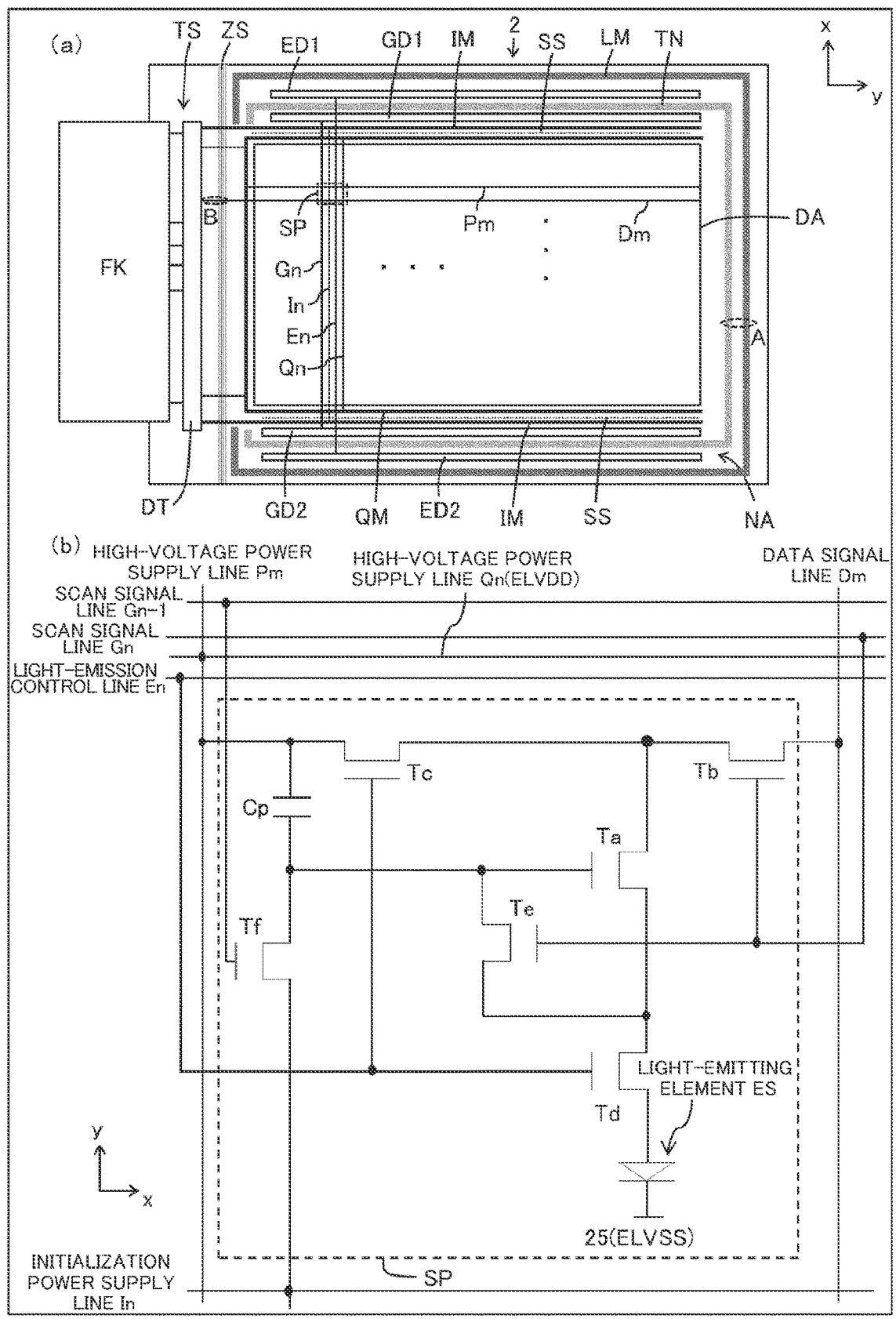
FIG. 1(a) is a set of schematic diagrams of an exemplary structure of a display device.
FIG. 1(b) is a circuit diagram of an exemplary structure of a pixel circuit.

Referring to FIG. 1, a display device 2 has: a display area DA in which there is provided a plurality of subpixels SP; and a frame area (non-display area) NA surrounding the display area DA. In the display area DA and the frame area NA are there provided scan signal lines (control lines) Gn running in the x-direction, data signal lines Dm running in the y-direction which is perpendicular to the x-direction, light-emission control lines (control lines) En running in the x-direction, high-voltage power supply lines Pm running in the y-direction, initialization power supply lines (power supply lines) In running in the x-direction, and high-voltage power supply lines (power supply lines) Qn running in the x-direction.

The display area DA is elongated in the y-direction. There are provided gate drivers (drivers) GD1 and GD2 and emission drivers (drivers) ED1 and ED2 along the two long sides of the display area DA in the frame area NA. There are provided a driver chip DT and a control board FK along one of the short sides of the display area DA in the frame area.

The data signal lines Dm are connected to the driver chip DT. The scan signal lines Gn and Gn+1 are connected to the gate drivers GD1 and GD2. The light-emission control lines En and En+1 are connected to the emission drivers ED1 and ED2. The high-voltage power supply lines Pm and Qn are electrically connected to each other and also to a first main power supply line QM (main high-voltage power supply line). The first main power supply line QM is supplied with a high power supply voltage (ELVDD) from the driver chip DT. The initialization power supply line In is connected to a second main power supply line IM. The second main power supply line IM is supplied with an initialization power (Vi) from the driver chip DT.

There are provided semiconductor lines SS (detailed later) in contact with the scan signal lines Gn, the light-emission control lines En, the high-voltage power supply lines Qn, and the initialization power supply lines In along the two long sides of the display area DA in the frame area NA.

Each subpixel SP includes a light-emitting element ES and is connected to one of the data signal lines Dm, one of the scan signal lines Gn, one of the light-emission control lines En, either one or both of the high-voltage power supply lines Pm and Qn, and one of the initialization power supply lines In. A capacitor Cp has one of the electrodes thereof connected to either one of the high-voltage power supply lines Pm and Qn and the other electrode thereof connected to the gate terminal of a driver transistor Ta. A write transistor Tb has the gate terminal thereof connected to one of the scan signal lines Gn. The driver transistor Ta has the source terminal thereof connected to one of the data signal lines Dm via the write transistor Tb and the drain terminal thereof connected to one of the light-emitting elements ES via a light emission control transistor Td.

Figure 2:
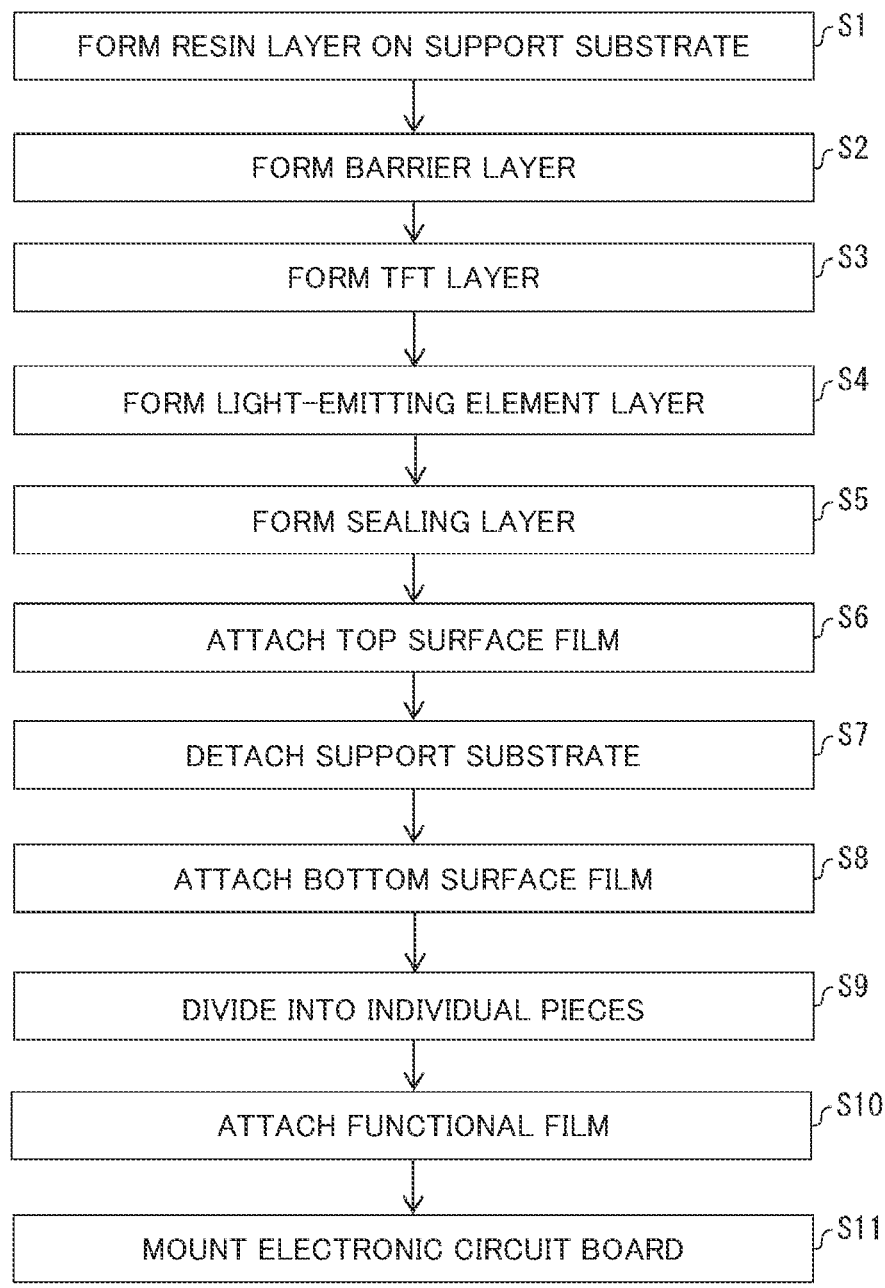
FIG. 2 is a flow chart representing an exemplary method of manufacturing a display device.
Figure 3:
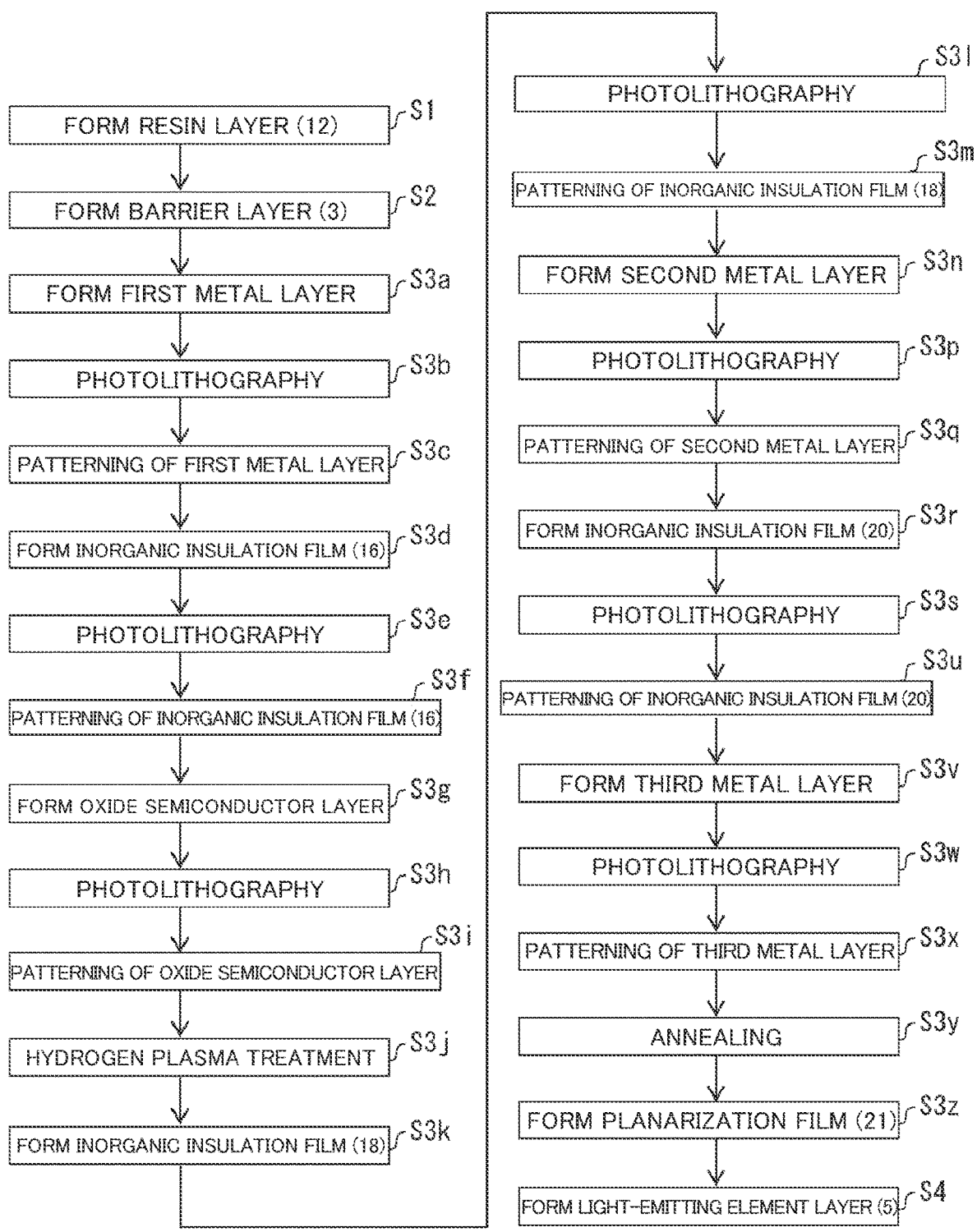
FIG. 3 is a detailed flow chart representing a method of manufacturing a display device in accordance with Embodiment 1.
Figure 4:
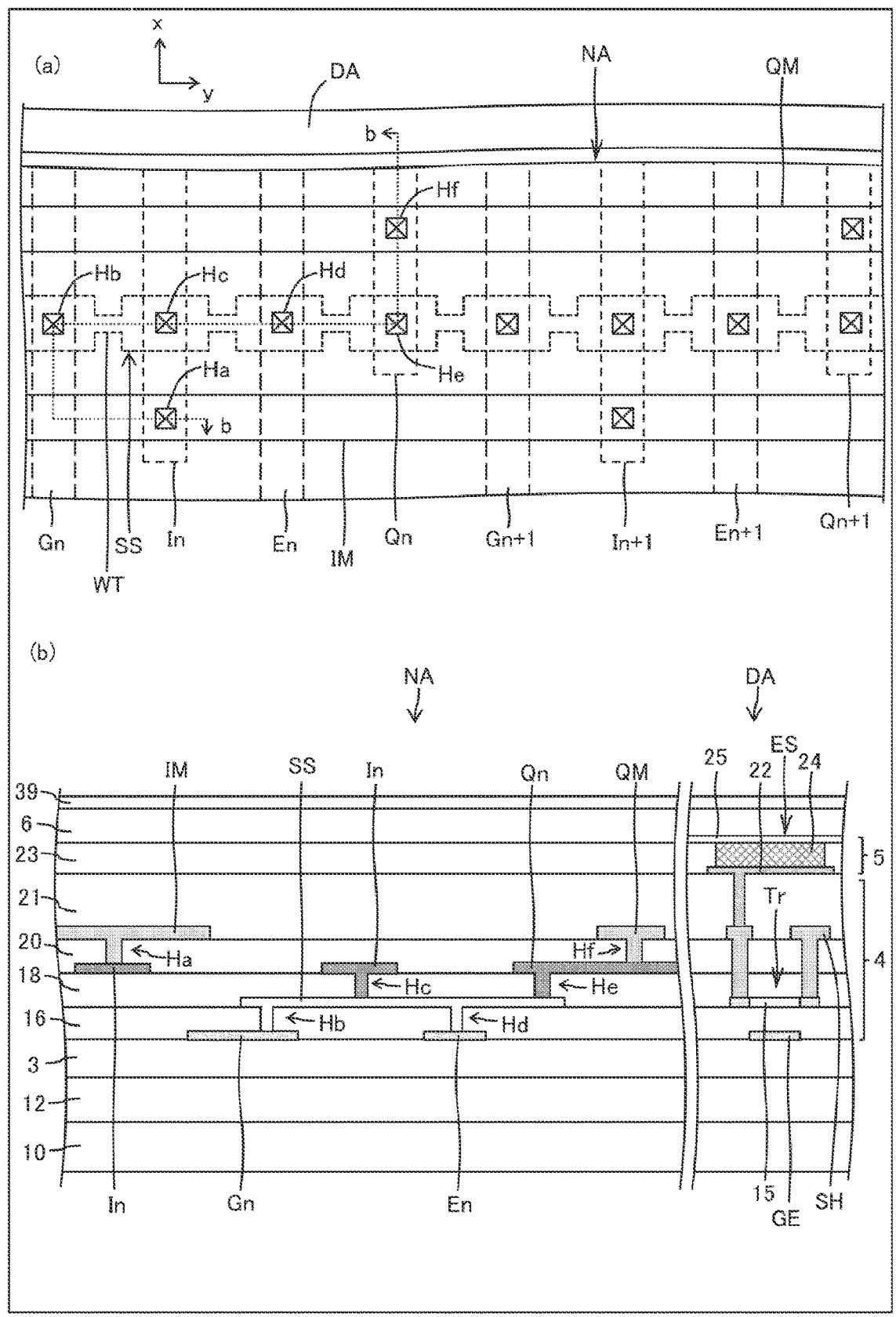
FIG. 4(a) is a plan view of a structure of a frame area and a display area in accordance with Embodiment 1.
FIG. 4(b) is a cross-sectional view taken along line b-b shown in FIG. 4(a).

Referring to FIGS. 2 to 4, to manufacture a flexible display device, a resin layer 12 is first formed on a transparent support substrate (e.g., mother glass) (step S1). Next, a barrier layer 3 is formed (step S2). Next, a TFT layer 4 is formed (step S3). Next, a top-emission light-emitting element layer 5 is formed (step S4). Next, a sealing layer 6 is formed (step S5). Next, a top surface film is attached onto the sealing layer 6 (step S6).

Next, the support substrate is detached from the resin layer 12 by, for example, laser irradiation (step S7). Next, a bottom surface film 10 is attached to the bottom face of the resin layer 12 (step S8). Next, the stack of the bottom surface film 10, the resin layer 12, the barrier layer 3, the TFT layer 4, the light-emitting element layer 5, and the sealing layer 6 is divided into individual pieces (step S9). Next, a functional film 39 is attached to the obtained individual pieces (step S10). Next, an electronic circuit board (the driver chip DT, the control board FK) is mounted to a part of the frame area (terminal section) (step S11). Steps S1 to S11 are carried out by display device manufacturing apparatus (including film-forming apparatus that performs steps S1 to S5).

The resin layer 12 is made of, for example, polyimide. The resin layer 12 may be replaced by a combination of two resin films (e.g., polyimide films) and an inorganic insulation film interposed between these two resin films.

The barrier layer (barrier film) 3 prevents foreign materials such as water and oxygen from reaching the TFT layer 4 and the light-emitting element layer 5. The barrier layer 3 may include, for example, a silicon oxide film, a silicon nitride film, a silicon oxynitride film, or a stack of these films. The films can be formed by CVD.

The TFT layer 4 includes: a first metal layer (including gate electrodes GE, the scan signal lines Gn, and the light-emission control lines En) overlying the barrier layer 3; an inorganic insulation film 16 (gate insulation film) overlying the first metal layer; an oxide semiconductor layer (including a semiconductor film 15 and the semiconductor lines SS) overlying the inorganic insulation film 16; an inorganic insulation film 18 (first inorganic insulation film) overlying the oxide semiconductor layer; a second metal layer (including the high-voltage power supply lines Qn and the initialization power supply lines In) overlying the inorganic insulation film 18; an inorganic insulation film 20 (second inorganic insulation film) overlying the second metal layer; a third metal layer (including source lines SH, the first main power supply line QM, the second main power supply line IM, and the data signal lines Dm) overlying the inorganic insulation film 20; and a planarization film 21 overlying the third metal layer, as shown in FIGS. 3 and 4.

The oxide semiconductor layer is made of, for example, an In—Ga—Zn—O-based semiconductor. Each thin film transistor Tr is structured so as to include one of the gate electrodes GE and the semiconductor film 15.

The first metal layer, the second metal layer, and the third metal layer are made of, for example, a monolayer or multilayer film of at least one of metals of aluminum, tungsten, molybdenum, tantalum, chromium, titanium, and copper.

The inorganic insulation films 16, 18, and 20 may be made of, for example, a film of silicon oxide (SiOx) or silicon nitride (SiNx) formed by CVD or a stack of these films. The planarization film 21 may be made of, for example, an organic material, such as polyimide or acrylic resin, that can be provided by coating.

The light-emitting element layer 5 includes an anode 22 overlying the planarization film 21, an insulating edge cover 23 covering an edge of the anode 22, an EL (electroluminescence) layer 24 overlying the edge cover 23, and a cathode 25 overlying the EL layer 24. The edge cover 23 is formed, for example, by patterning applied organic material such as polyimide or acrylic resin by photolithography.

The light-emitting element ES (e.g., OLED (organic light-emitting diode) or QLED (quantum dot light-emitting diode)), including the insular anode 22, the EL layer 24, and the cathode 25, is formed for each subpixel in the light-emitting element layer 5. There is provided a control circuit for the light-emitting element ES in the TFT layer 4. A pixel circuit includes the-light-emitting element ES and the control circuit.

The EL layer 24 includes, for example, a stack of a hole injection layer, a hole transport layer, a light-emitting layer, an electron transport layer, and an electron injection layer arranged in this order when viewed from below. The light-emitting layer is formed in an insular manner for each opening in the edge cover 23 (i.e., for each subpixel) by vapor deposition or inkjet technology. Other layers are provided either in an insular manner or as a common layer across all the openings. One or more of the hole injection layer, the hole transport layer, the electron transport layer, and the electron injection layer may be omitted.

A FMM (fine metal mask) is used in forming the light-emitting layer for OLEDs by vapor deposition. A FMM is a sheet of, for example, an invar material with numerous openings. An organic material that has passed through an opening forms an insular light-emitting layer (corresponding to one subpixel).

An insular QLED light-emitting layer (corresponding to one subpixel) may be formed, for example, by applying a solvent containing diffused quantum dots by inkjet coating.

The anode 22 includes a stack of, for example, ITO (indium tin oxide) and either Ag (silver) or a Ag-containing alloy, so that the anode 22 is light-reflective. The cathode 25 may be formed of a transparent conductive material such as a Mg—Ag alloy (super thin film), ITO, or IZO (indium zinc oxide).

When the light-emitting element ES is an OLED, holes and electrons recombine in the light-emitting layer due to a drive current flowing between the anode 22 and the cathode 25, to produce excitons that transition to the ground state to emit light. Since the cathode 25 is transparent, and the anode 22 is light-reflective, the light emitted by the EL layer 24 travels upwards, thereby achieving "top emission."

When the light-emitting element ES is a QLED, holes and electrons recombine in the light-emitting layer due to a drive current flowing between the anode 22 and the cathode 25, to produce excitons that transition from the conduction band to the valence band of the quantum dot to emit light (fluorescence).

The light-emitting element layer 5 may include light-emitting elements other than the OLEDs and QLEDs, such as inorganic light-emitting diodes.

The sealing layer 6 is transparent and includes an inorganic sealing film 26 covering the cathode 25, an organic buffer film 27 overlying the inorganic sealing film 26, and an inorganic sealing film 28 overlying the organic buffer film 27. The sealing layer 6, covering the light-emitting element layer 5, prevents foreign materials such as water and oxygen from reaching the light-emitting element layer 5.

The inorganic sealing film 26 and the inorganic sealing film 28 are inorganic insulation films and may each include, for example, a silicon oxide film, a silicon nitride film, a silicon oxynitride film, or a stack of these films. The films can be formed by CVD. The organic buffer film 27 is a transparent organic film that exhibits a planarization effect. The organic buffer film 27 may be made of an organic material, such as acrylic resin, that can be provided by coating. The organic buffer film 27 may be formed, for example, by inkjet coating. When that is actually the case, there may be provided a bank in the non-display area to stop liquid drops.

The bottom surface film 10 is, for example, a PET film attached to the bottom face of the resin layer 12 after the support substrate is detached, thereby providing for a highly flexible display device. The functional film 39 has, for example, at least one of an optical compensation function, a touch sensor function, and a protection function.

The description has so far focused on the flexible display device. To manufacture a non-flexible display device, for example, steps S9 to S11 shown in FIG. 2 may be performed after the stack of the barrier layer 3, the TFT layer 4, the light-emitting element layer 5, and the sealing layer 6 is formed on the substrate (e.g., glass substrate).

Figure 5:
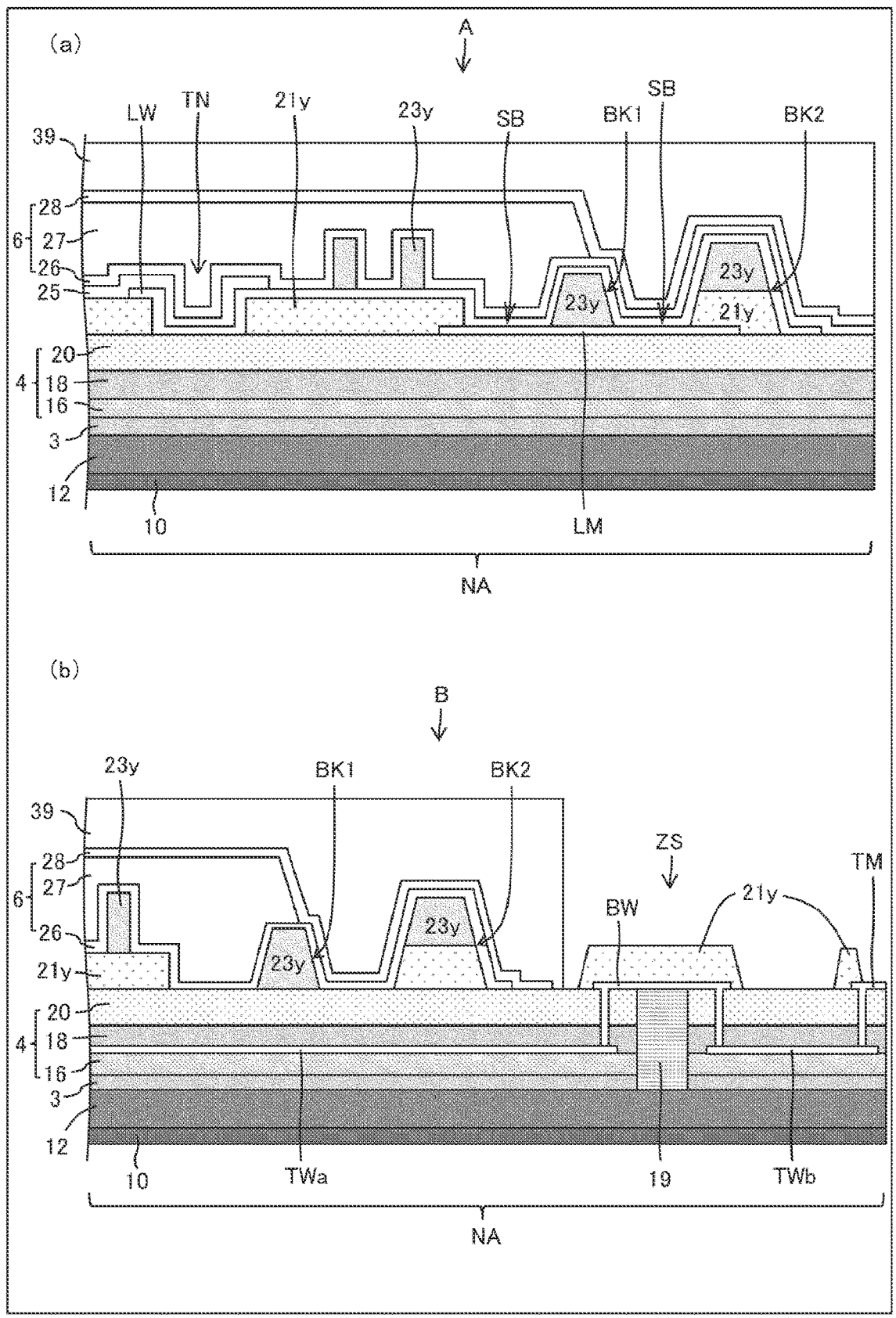
FIG. 5 is a set of cross-sectional views of region A and region B shown surrounded by a broken line in FIG. 1(a).

There is provided a trench TN in the frame area NA as shown in FIG. 5(a). The trench TN is formed through an organic insulation film 21y residing in the same layer as the planarization film 21 as shown in FIG. 4 and an organic insulation film 23y residing in the same layer as the edge cover 23 as shown in FIG. 4. The cathode 25 is connected in the trench TN to a relay line LW residing in the same layer as the anode 22 as shown in FIG. 4. There is provided a connecting section SB through the organic insulation film 21y and the organic insulation film 23y. The relay line LW is connected in the connecting section SB to a low-voltage (ELVSS) main power supply line LM residing in the third metal layer. Banks BK1 and BK2 serve as a liquid stop in forming the organic buffer film 27 by inkjet technology. There is provided a bending portion ZS through the barrier layer 3 and the inorganic insulation films 16, 18, and 20. These portions of the bending portion ZS through the barrier layer 3 and the inorganic insulation films 16, 18, and 20 are filled with an organic insulation film 19 formed in a step between step S3u and step S3v shown in FIG. 3.

There is provided a terminal line TWa residing in the first metal layer and electrically connected to the display area DA. The terminal line TWa is connected to a terminal TM residing in the third metal layer via a bridge line BW residing in the third metal layer in the bending portion ZS and a terminal line TWb residing in the first metal layer in the bending portion ZS. The bridge line BW and the terminal TM have the edges thereof covered by the organic insulation film 21y residing in the same layer as the planarization film 21 shown in FIG. 4.

Embodiment 1

In Embodiment 1, the transistors in the display area DA have a bottom-gate structure, and the semiconductor lines SS are provided in contact with the top face of the inorganic insulation film 16, as shown in FIG. 4. The semiconductor lines SS reside outside the two long sides of the display area DA (in the frame area NA) and extend in the y-direction.

The semiconductor lines SS, residing in the oxide semiconductor layer, are disposed, in a plan view thereof, in a gap between the first main power supply line QM and the second main power supply line IM both residing in the third metal layer and extending in the y-direction. The semiconductor lines SS, again in a plan view thereof, cross the scan signal lines Gn and Gn+1 residing in the first metal layer, the light-emission control lines En and En+1 residing in the first metal layer, the high-voltage power supply lines Qn and Qn+1 residing in the second metal layer, and the initialization power supply lines In and In+1 residing in the second metal layer, all extending in the x-direction.

As shown in FIG. 4, the scan signal line Gn, the initialization power supply line In, the light-emission control line En, and the high-voltage power supply line Qn appear in this order when traced in the y-direction in a plan view. The scan signal line Gn is in contact with the semiconductor line SS in a contact hole Hb (opening) formed in the inorganic insulation film 16 (gate insulation film). The initialization power supply line In is in contact with the semiconductor line SS in a contact hole Hc (opening) formed in the inorganic insulation film 18 (first inorganic insulation film). The light-emission control line En is in contact with the semiconductor line SS in a contact hole Hd (opening) formed in the inorganic insulation film 16. The high-voltage power supply line Qn is in contact with the semiconductor line SS in a contact hole He (opening) formed in the inorganic insulation film 18.

The first main power supply line QM, residing in the third metal layer, crosses the initialization power supply lines In and In+1 and the high-voltage power supply lines Qn and Qn+1. As an example, the first main power supply line QM and the high-voltage power supply line Qn are electrically connected through a contact hole Hf formed in the inorganic insulation film 20. The first main power supply line QM transfers a subpixel-driving high power supply voltage (ELVDD) to the high-voltage power supply line Qn.

The second main power supply line IM, residing in the third metal layer, crosses the initialization power supply lines In and In+1. As an example, the second main power supply line IM and the initialization power supply line In are electrically connected through a contact hole Ha formed in the inorganic insulation film 20 (second inorganic insulation film). The second main power supply line IM does not cross the high-voltage power supply lines Qn and Qn+1. The second main power supply line IM transfers an initialization power supply voltage to the initialization power supply line In.

The scan signal lines Gn and Gn+1 are connected to a gate driver (see FIG. 1) via the third metal layer. The light-emission control lines En and En+1 are connected to an emission driver (see FIG. 1) via the third metal layer.

Figure 6:
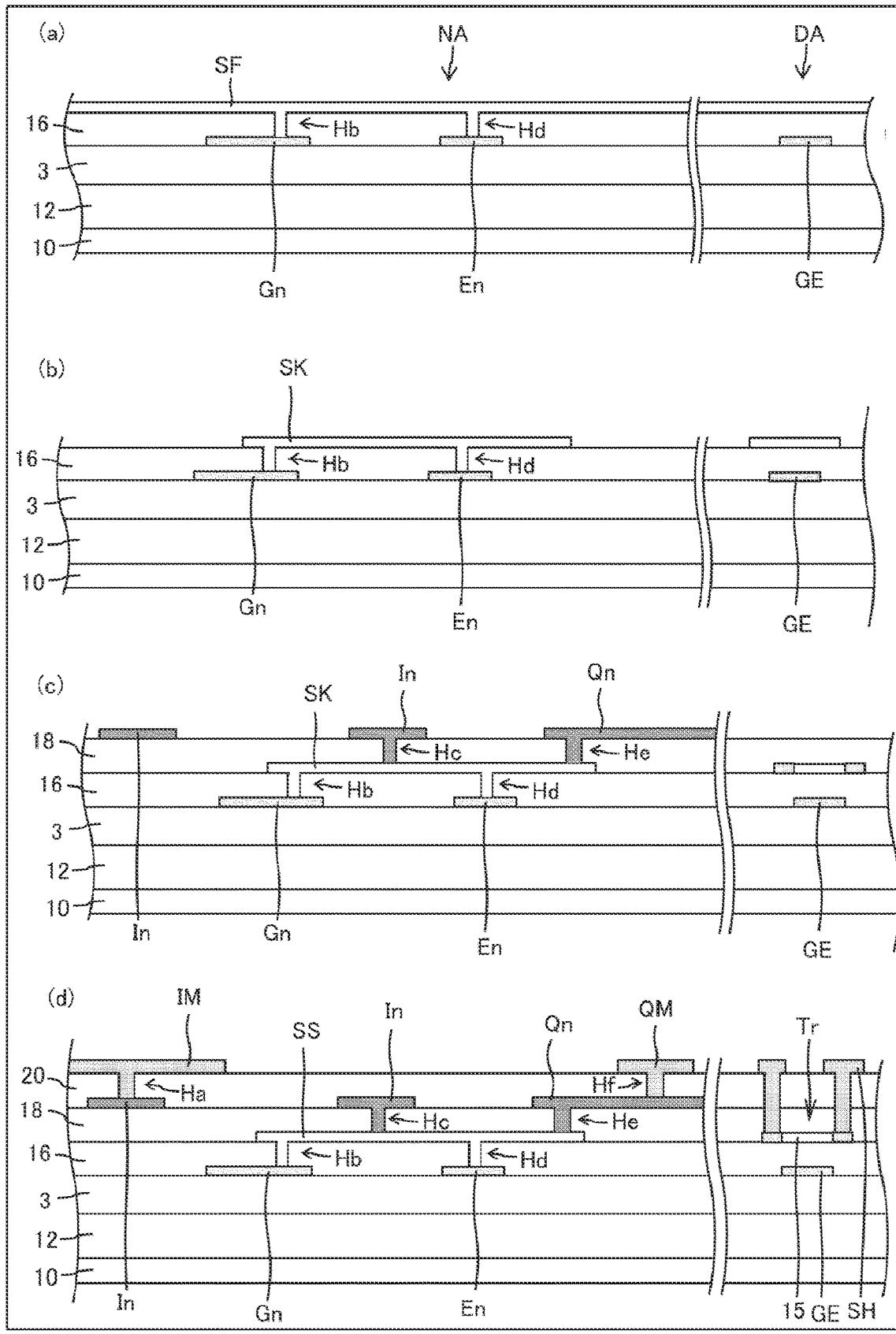
FIG. 6 is a set of manufacturing process diagrams of how semiconductor lines are formed in accordance with Embodiment 1.

FIGS. 3 and 6 show semiconductor-line-forming steps in accordance with Embodiment 1. Steps S3a to S3c in FIG. 3 form the first metal layer containing the scan signal lines Gn and the light-emission control lines En therein. Steps S3d to S3f form the inorganic insulation film 16 (gate insulation film including an underlying silicon oxide film and an overlying silicon nitride film) covering the first metal layer.

Step S3g in FIG. 3 forms an oxide semiconductor film SF on the inorganic insulation film 16 as shown in FIG. 6(a). Thus, the scan signal line Gn is in contact with the oxide semiconductor film SF in the contact hole Hb formed in the inorganic insulation film 16, and the light-emission control line En is in contact with the oxide semiconductor film SF in the contact hole Hd formed in the inorganic insulation film 16. Steps S3g to S3i form the oxide semiconductor layer.

Step S3j subjects the surface of the oxide semiconductor layer to hydrogen plasma treatment, which reduces the oxide semiconductor film SF to a conductor film SK shown in FIG. 6(b). Steps S3k to S3m form the inorganic insulation film 18 (silicon nitride film) covering the conductor film SK.

Steps S3n to S3q form the second metal layer containing the high-voltage power supply lines Qn and the initialization power supply lines In therein. Step S3q (of patterning the second metal layer) brings the initialization power supply line In into contact with the conductor film SK in the contact hole Hc formed in the inorganic insulation film 18 and brings the high-voltage power supply line Qn into contact with the conductor film SK in the contact hole He formed in the inorganic insulation film 18, as shown in FIG. 6(c).

Steps S3r to 3u form the inorganic insulation film 20 (silicon oxide film). Steps S3v to 3x form the third metal layer containing the first main power supply line QM and the second main power supply line IM therein. Thus, the initialization power supply line In is in contact with the second main power supply line IM in the contact hole Ha formed in the inorganic insulation film 20, and the high-voltage power supply line Qn is in contact with the first main power supply line QM in the contact hole Hf formed in the inorganic insulation film 20.

Next, step S3y in FIG. 3 performs annealing, which enables the silicon oxide film in the inorganic insulation film 16 (gate insulation film) to feed oxygen to the conductor film SK, that is, which oxidizes the conductor film SK to the semiconductor line SS (oxide semiconductor) shown in FIG. 6(d). Step S3z forms the planarization film 21.

In the technology shown in FIGS. 3, 4, and 6, prior to the formation of the third metal layer in step S3v in FIG. 3, step S3j electrically connects the scan signal lines Gn and the light-emission control lines En to the conductor film SK, thereby restraining the ESD-caused short-circuiting of wiring in the first metal layer (e.g., short-circuiting between the scan signal lines and the light-emission control lines).

In addition, prior to the formation of the third metal layer, step S3q (of patterning the second metal layer) electrically connects the initialization power supply lines In and the high-voltage power supply lines Qn to the conductor film SK, thereby restraining the ESD-caused short-circuiting of wiring in the second metal layer (e.g., short-circuiting between the initialization power supply lines and the high-voltage power supply lines) and restraining the ESD-caused short-circuiting of wiring between the first metal layer and the second metal layer (e.g., between the scan signal lines and either the initialization power supply lines or the high-voltage power supply lines and between the light-emission control lines and either the initialization power supply lines or the high-voltage power supply lines).

As shown in FIG. 4, in a plan view, the semiconductor line SS has narrowed portions WT, one each in a gap between the scan signal line Gn and the initialization power supply line In, a gap between the initialization power supply line In and the light-emission control line En, a gap between the light-emission control line En and the high-voltage power supply line Qn, and a gap between the high-voltage power supply line Qn and the scan signal line Gn+1. The line width in the narrowed portions WT is smaller than the line widths of the first main power supply line QM, the second main power supply line IM, the scan signal line Gn, the initialization power supply line In, the light-emission control line En, the high-voltage power supply line Qn, and the scan signal line Gn+1. Hence, if high static electricity occurs in any of these lines, ESD is likely to occur in one of the narrowed portions WT of the semiconductor line SS. This particular structure therefore reduces the risk of ESD-caused short-circuiting of the first main power supply line QM, the second main power supply line IM, the scan signal line Gn, the initialization power supply line In, the light-emission control line En, the high-voltage power supply line Qn, and the scan signal line Gn+1.

FIG. 4 shows a structure where the semiconductor line SS, either the scan signal line Gn or the light-emission control line En, and either the initialization power supply line In or the high-voltage power supply line Qn do not overlap. If there was an overlap between these lines, the semiconductor line would behave like a conductor, not as a semiconductor, when these lines are addressed, thereby forming a current path (short-circuiting path).

Figure 7:
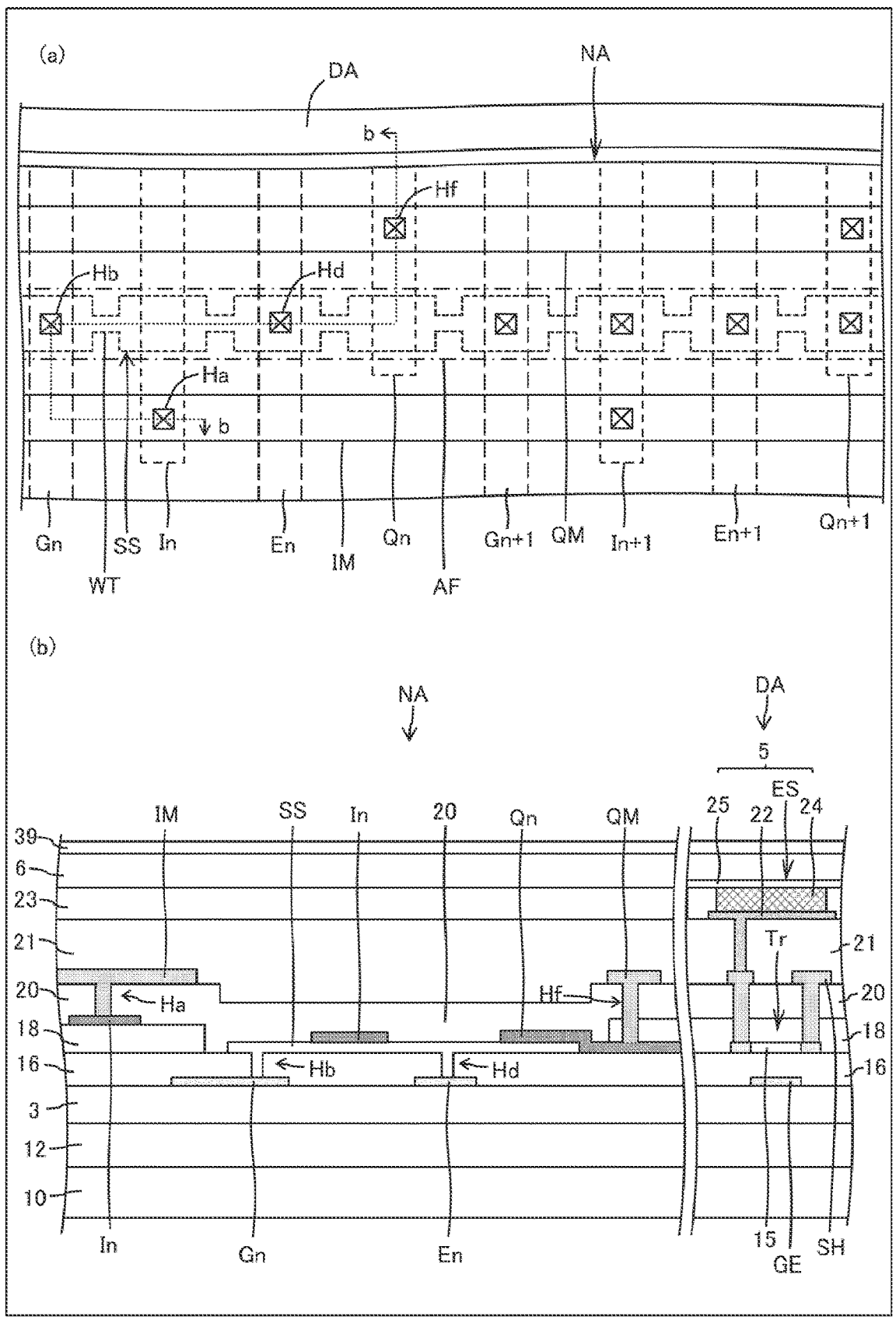
FIG. 7(a) is a plan view of another structure of the frame area and the display area in accordance with Embodiment 1.
FIG. 7(b) is a cross-sectional view taken along line b-b shown in FIG. 7(a).

As a modification to Embodiment 1, a hole may be formed through the inorganic insulation film 18 in an elongated area AF containing the semiconductor line SS therein, so that the semiconductor line SS can be connected to the inorganic insulation film 20 (silicon oxide film), as shown in FIG. 7. This particular structure, in step S3y (annealing step) shown in FIG. 3, enables the inorganic insulation film 20 (silicon oxide film) to feed oxygen to the conductor film SK, which is a precursor to the semiconductor line SS, thereby ensuring that the conductor film SK is oxidized to the semiconductor line SS.

Figure 8:
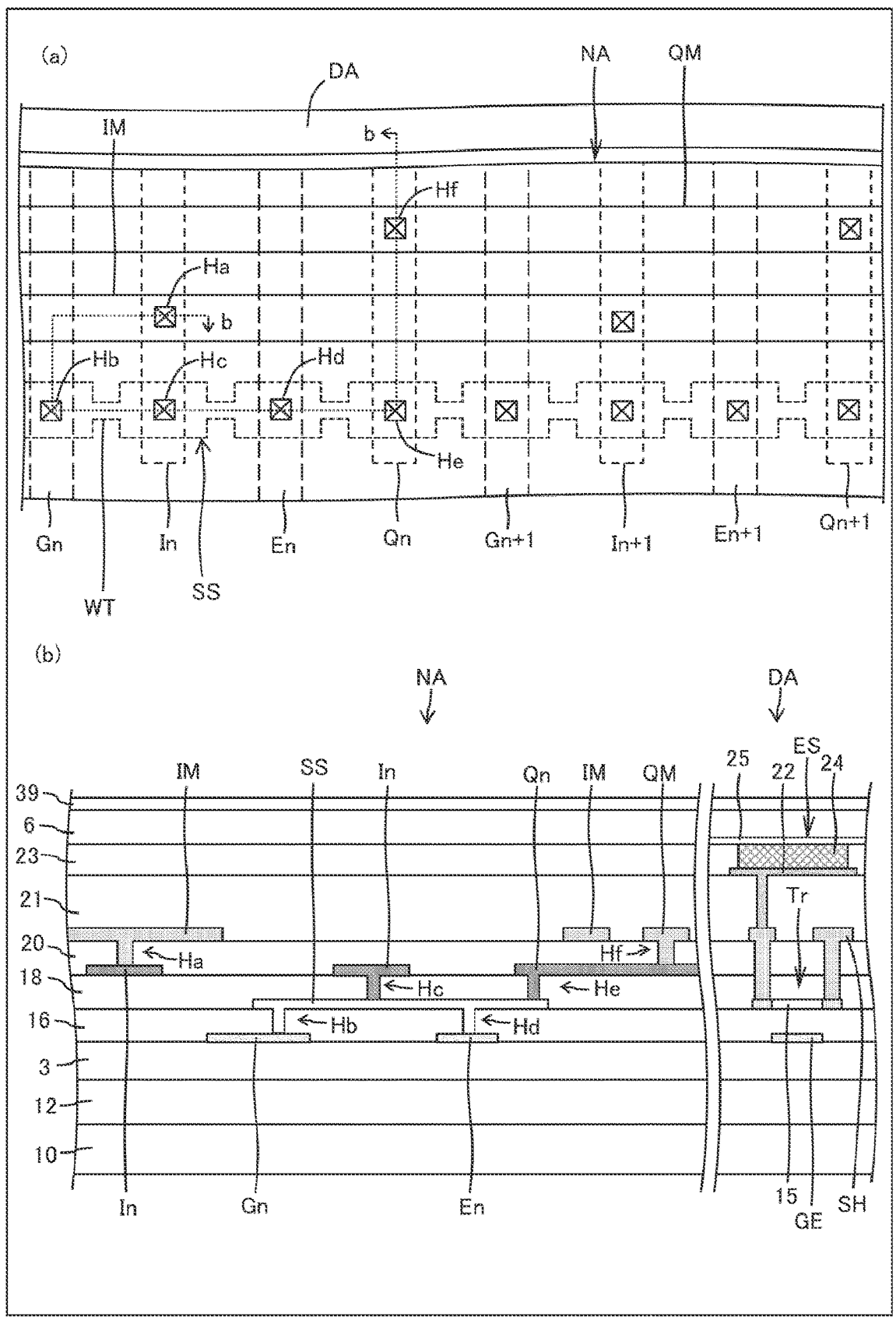
FIG. 8(a) is a plan view of yet another structure of the frame area and the display area in accordance with Embodiment 1.
FIG. 8(b) is a cross-sectional view taken along line b-b shown in FIG. 8(a).

FIG. 4 shows the semiconductor line SS being disposed in a gap between the first main power supply line QM and the second main power supply line IM both extending in the y-direction. Alternatively, as shown in FIG. 8, the semiconductor line SS may be disposed outside the first main power supply line QM and the second main power supply line IM both extending in the y-direction (i.e., closer to the driver). This particular structure confines ESD, if ever, to outside the electrical connections between the second main power supply line IM and the initialization power supply lines In and In+1, thereby reducing adverse effects of ESD to the initialization power supply lines In and In+1.

Figure 9:
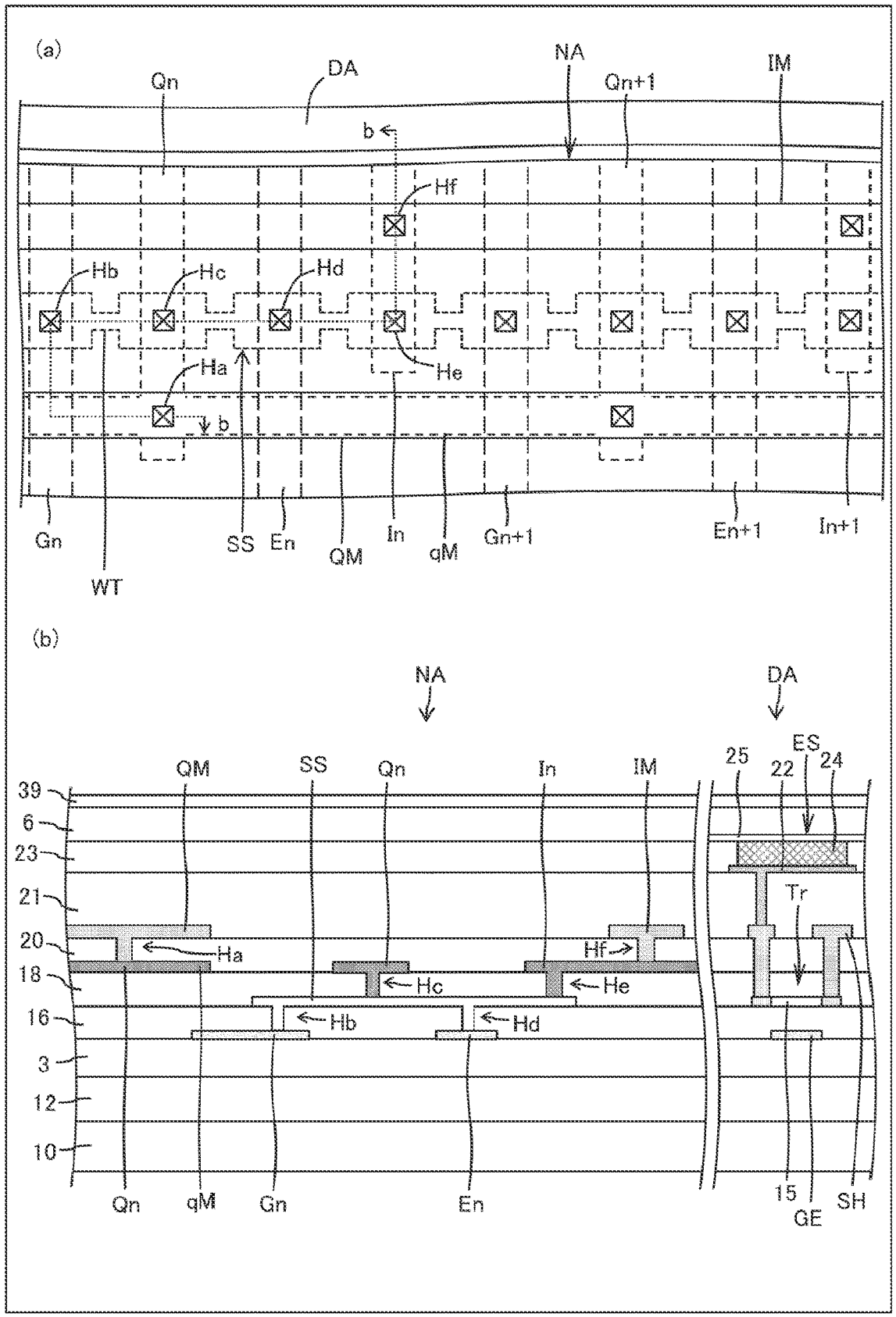
FIG. 9(a) is a plan view of still another structure of the frame area and the display area in accordance with Embodiment 1.
FIG. 9(b) is a cross-sectional view taken along line b-b shown in FIG. 9(a).

As another modification to Embodiment 1, there may be provided a third main power supply line qM (residing in the second metal layer) under the first main power supply line QM (residing in the third metal layer), the third main power supply line qM being connected to the high-voltage power supply lines Qn and Qn+1 in the same layer, as shown in FIG. 9.

Figure 10:
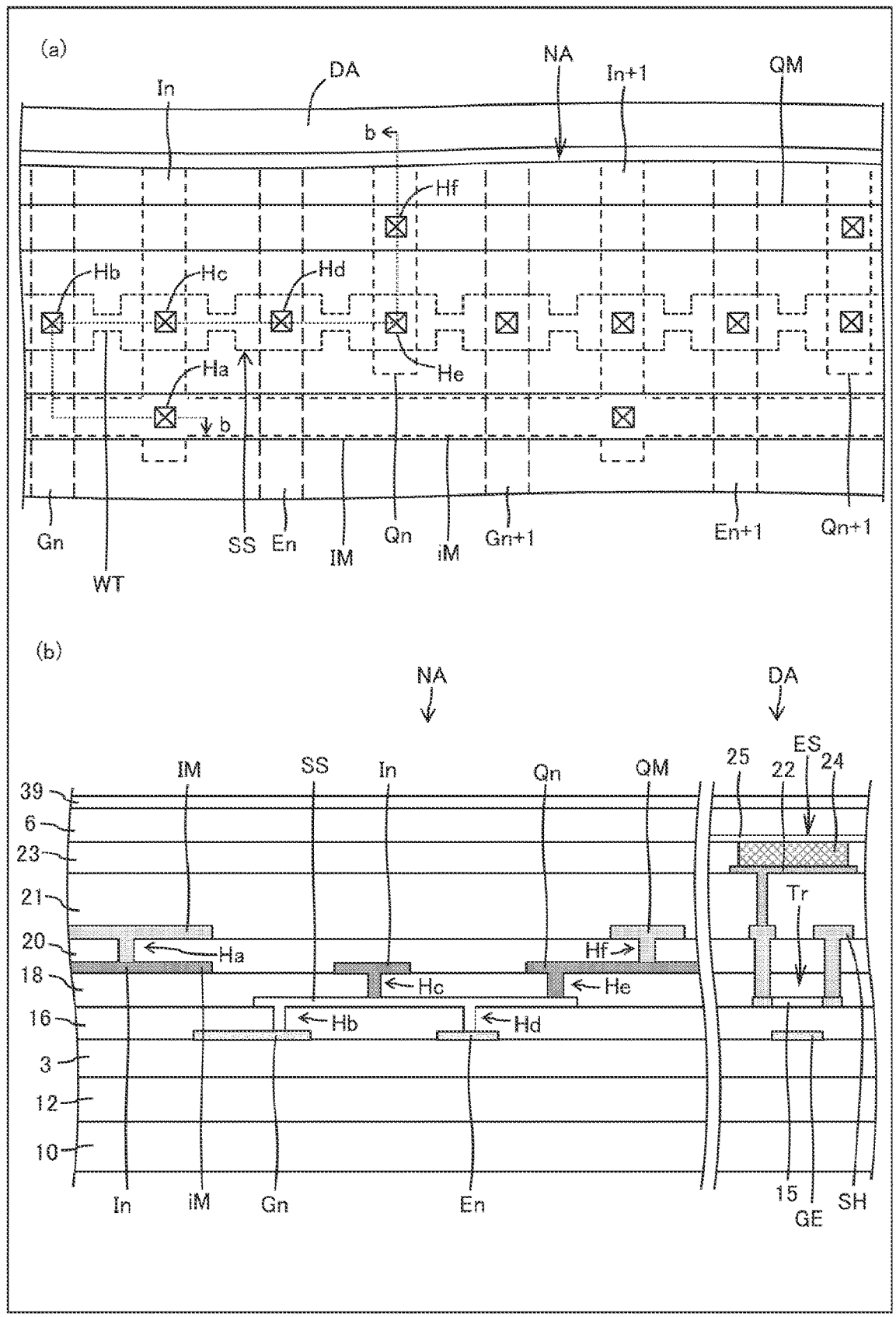
FIG. 10(a) is a plan view of yet still another structure of the frame area and the display area in accordance with Embodiment 1.
FIG. 10(b) is a cross-sectional view taken along line b-b shown in FIG. 10(a).

As yet another modification to Embodiment 1, there may be provided a fourth main power supply line iM (residing in the second metal layer) under the second main power supply line IM (residing in the third metal layer), the fourth main power supply line iM being connected to the initialization power supply lines In and In+1 in the same layer, as shown in FIG. 10.

Figure 11:
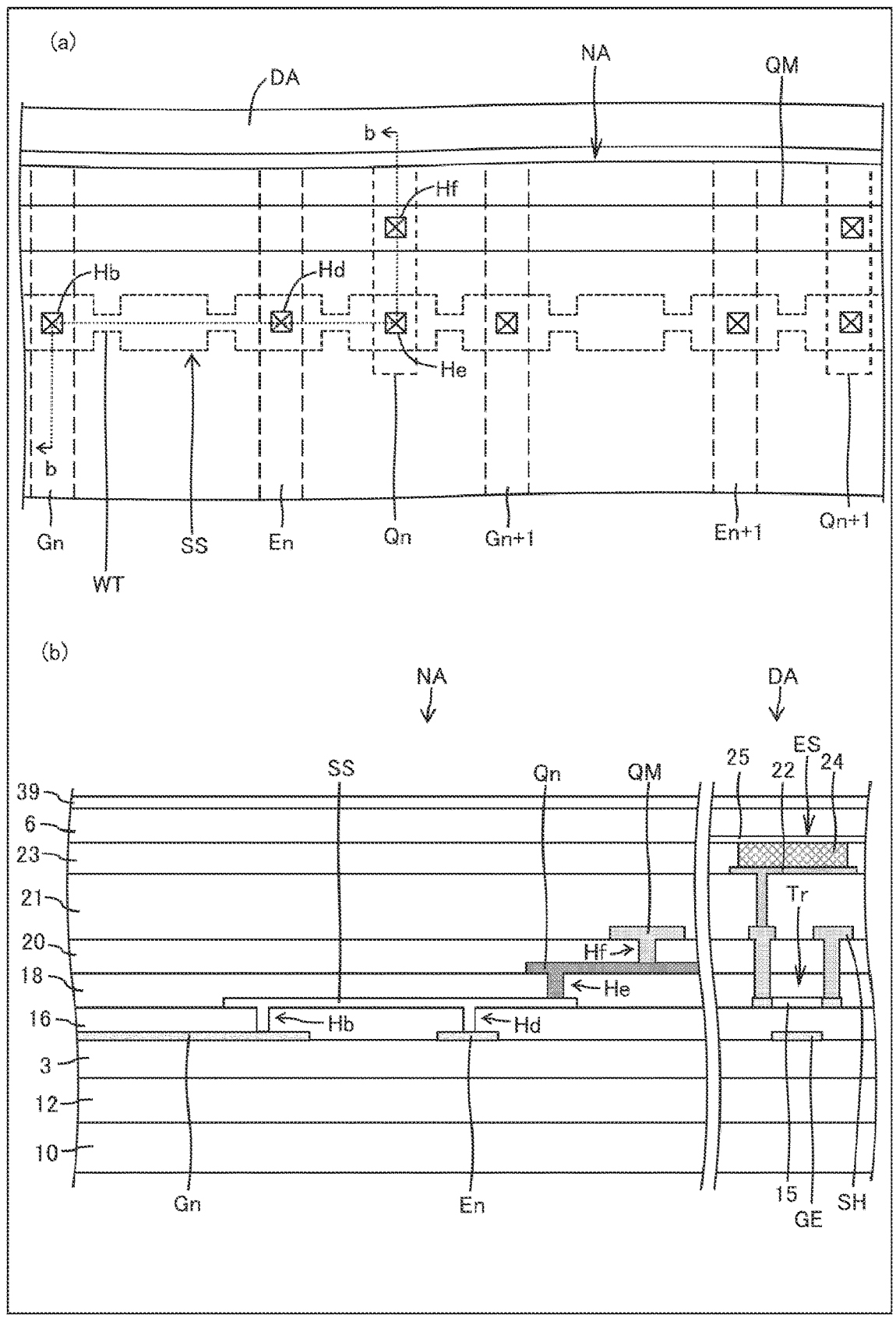
FIG. 11(a) is a plan view of a further structure of the frame area and the display area in accordance with Embodiment 1.
FIG. 11(b) is a cross-sectional view taken along line b-b shown in FIG. 11(a).
Figure 12:
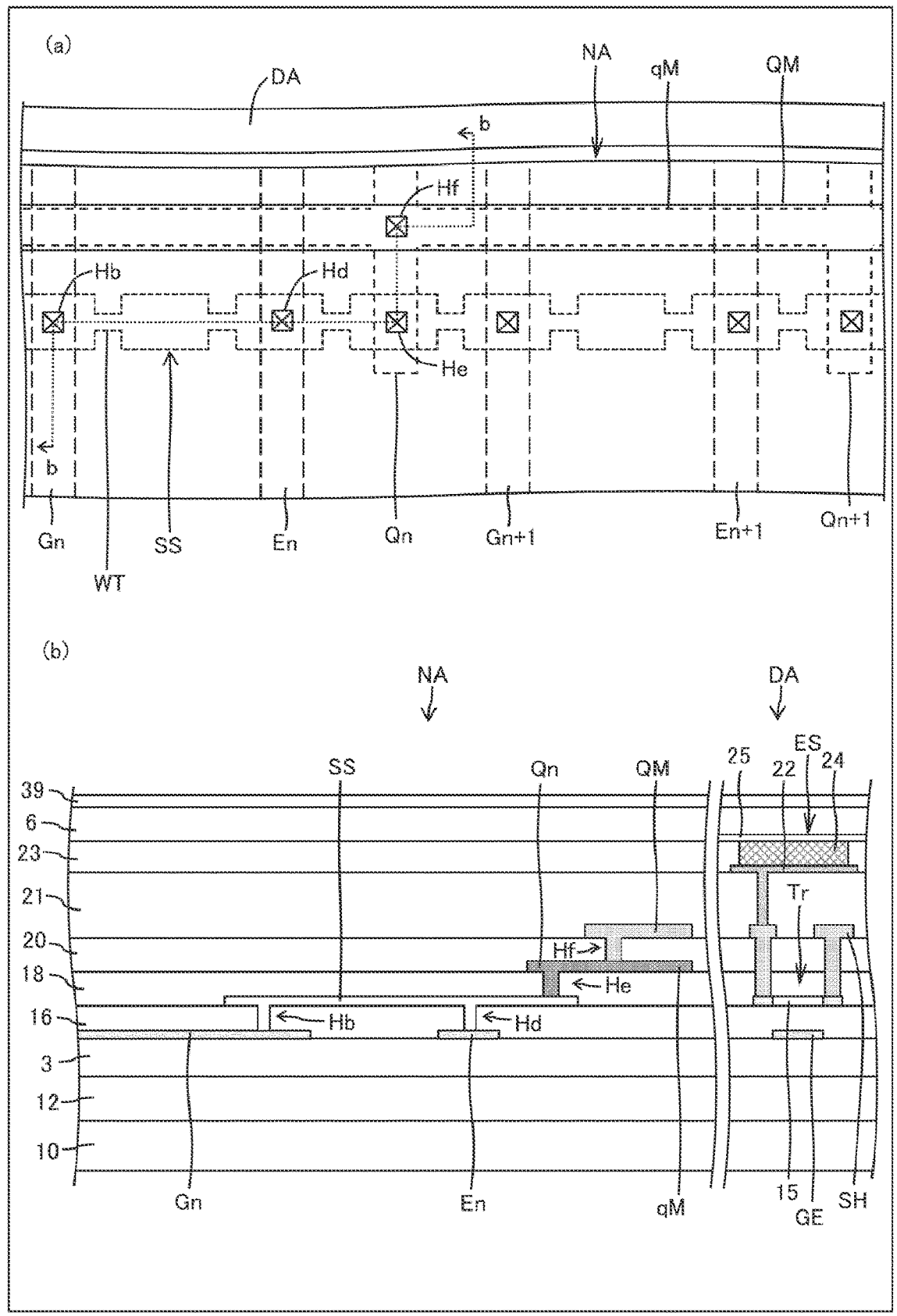
FIG. 12(a) is a plan view of yet a further structure of the frame area and the display area in accordance with Embodiment 1.
FIG. 12(b) is a cross-sectional view taken along line b-b shown in FIG. 12(a).

If the pixel circuit can be driven when the initialization power supply line and the high-voltage power supply line are at the same potential, the second main power supply line IM and the initialization power supply line In, among others, may be omitted as shown in FIG. 11. As a variation example to FIG. 11, there may be provided a third main power supply line qM (residing in the second metal layer) under the first main power supply line QM (residing in the third metal layer), the third main power supply line qM being connected to the high-voltage power supply lines Qn and Qn+1 in the same layer, as shown in FIG. 12.

Embodiment 2

Figure 13:
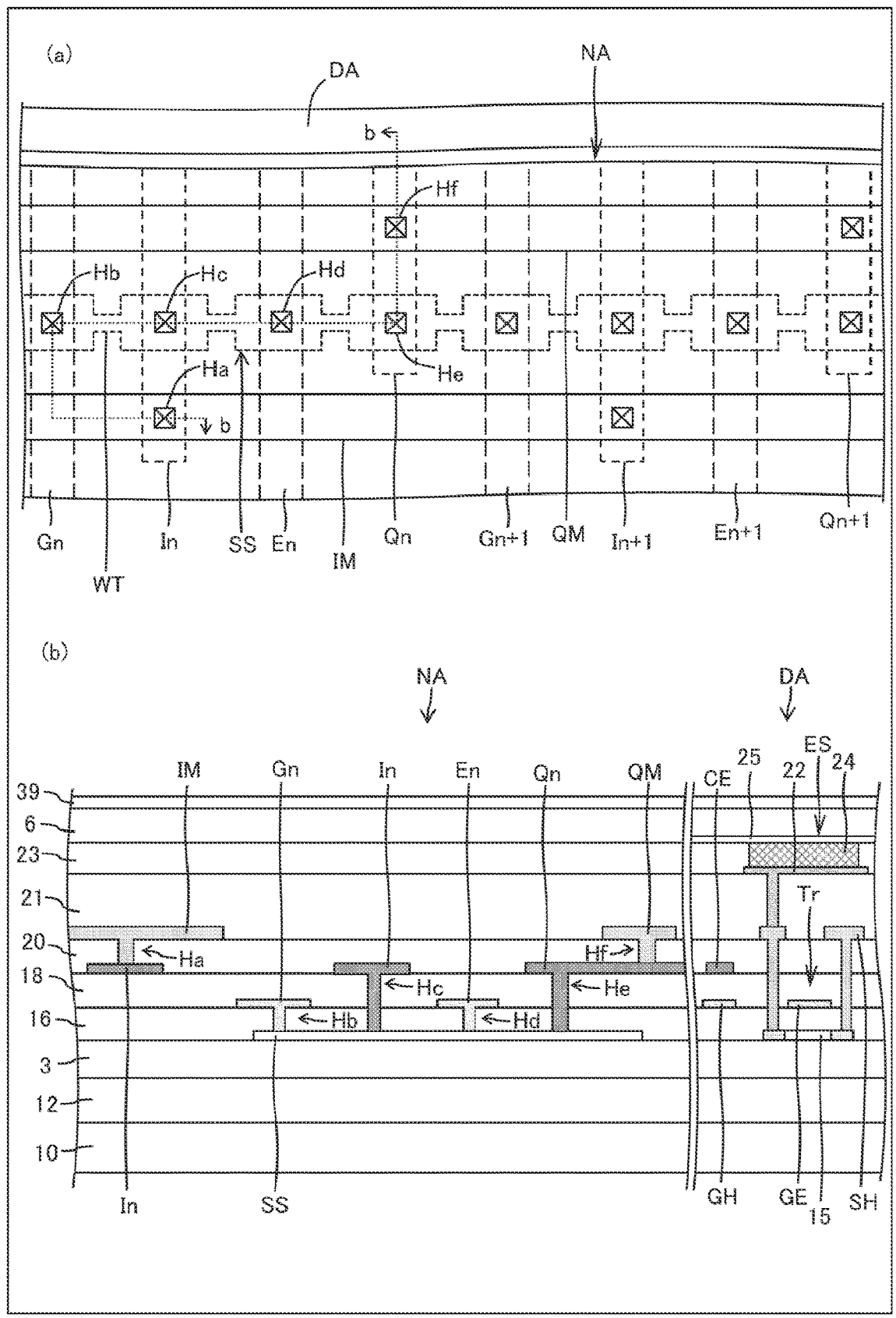
FIG. 13(a) is a plan view of a structure of a frame area and a display area in accordance with Embodiment 2.
FIG. 13(b) is a cross-sectional view taken along line b-b shown in FIG. 13(a).

In Embodiment 2, the transistors in the display area DA have a top-gate structure, and the semiconductor lines SS are provided in contact with the bottom face of the inorganic insulation film 16, as shown in FIG. 13. The semiconductor lines SS reside outside the two long sides of the display area DA (in the frame area NA) and extend in the y-direction.

The semiconductor lines SS, residing in the oxide semiconductor layer, are disposed, in a plan view thereof, in a gap between the first main power supply line QM and the second main power supply line IM both extending in the y-direction. The semiconductor lines SS, again in a plan view thereof, cross the scan signal lines Gn and Gn+1 residing in the first metal layer, the light-emission control lines En and En+1 residing in the first metal layer, the high-voltage power supply lines Qn and Qn+1 residing in the second metal layer, and the initialization power supply lines In and In+1 residing in the second metal layer, all extending in the x-direction.

As shown in FIG. 13, the scan signal line Gn, the initialization power supply line In, the light-emission control line En, and the high-voltage power supply line Qn appear in this order when traced in the y-direction in a plan view. The scan signal line Gn is in contact with the semiconductor line SS in a contact hole Hb (opening) formed in the inorganic insulation film 16. The initialization power supply line In is in contact with the semiconductor line SS in a contact hole Hc (opening) formed in the inorganic insulation films 16 and 18. The light-emission control line En is in contact with the semiconductor line SS in a contact hole Hd (opening) formed in the inorganic insulation film 16. The high-voltage power supply line Qn is in contact with the semiconductor line SS in a contact hole He (opening) formed in the inorganic insulation films 16 and 18.

The second main power supply line IM, residing in the third metal layer, crosses the initialization power supply lines In and In+1. As an example, the second main power supply line IM and the initialization power supply line In are electrically connected through a contact hole Ha formed in the inorganic insulation film 20. The second main power supply line IM does not cross the high-voltage power supply lines Qn and Qn+1.

The first main power supply line QM, residing in the third metal layer, crosses the initialization power supply lines In and In+1 and the high-voltage power supply lines Qn and Qn+1. As an example, the first main power supply line QM and the high-voltage power supply line Qn are electrically connected through a contact hole Hf formed in the inorganic insulation film 20.

The scan signal lines Gn and Gn+1 are connected to a gate driver (see FIG. 1) via the third metal layer. The light-emission control lines En and En+1 are connected to an emission driver (see FIG. 1) via the third metal layer.

Figure 14:
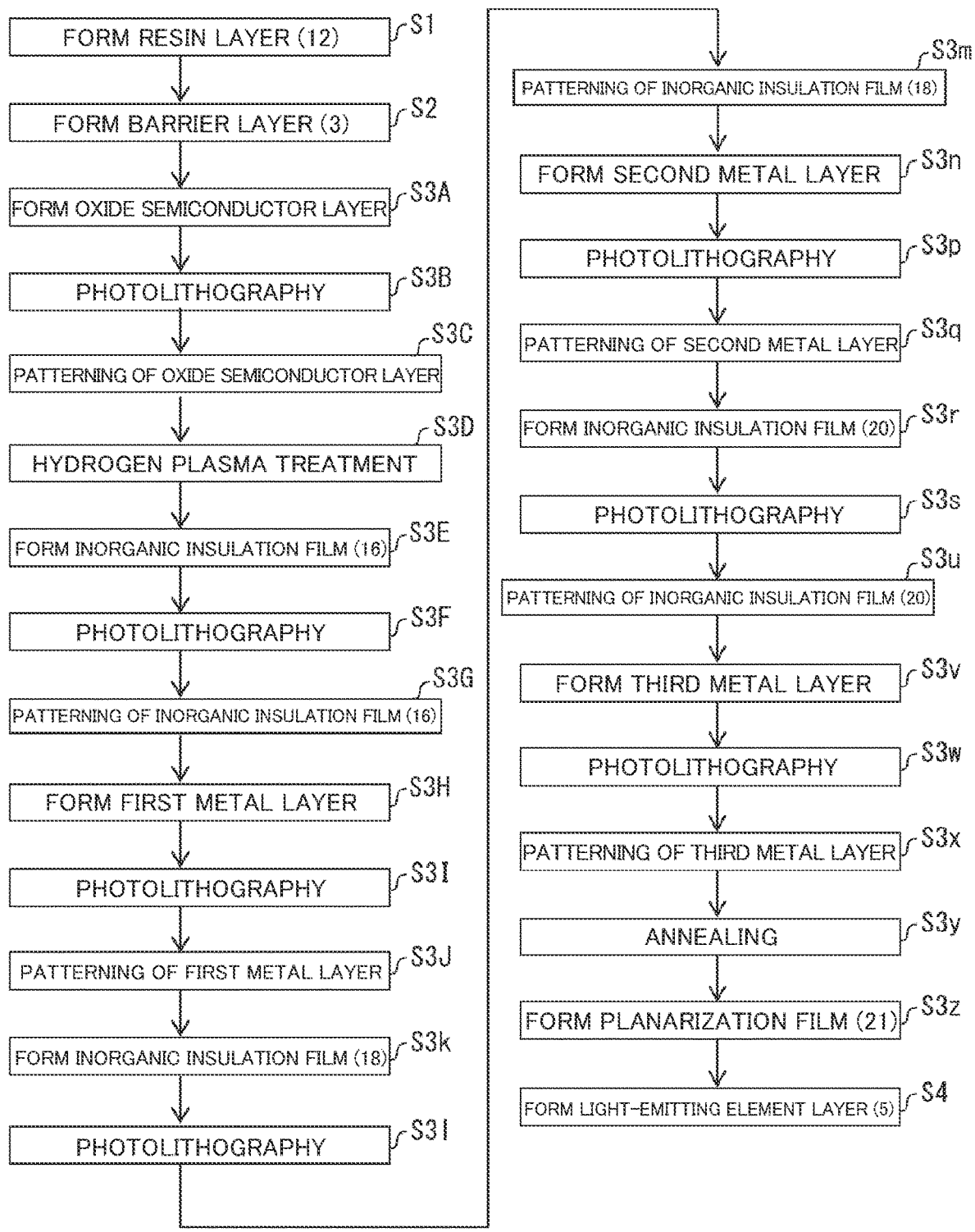
FIG. 14 is a detailed flow chart representing a method of manufacturing a display device in accordance with Embodiment 2.
Figure 15:
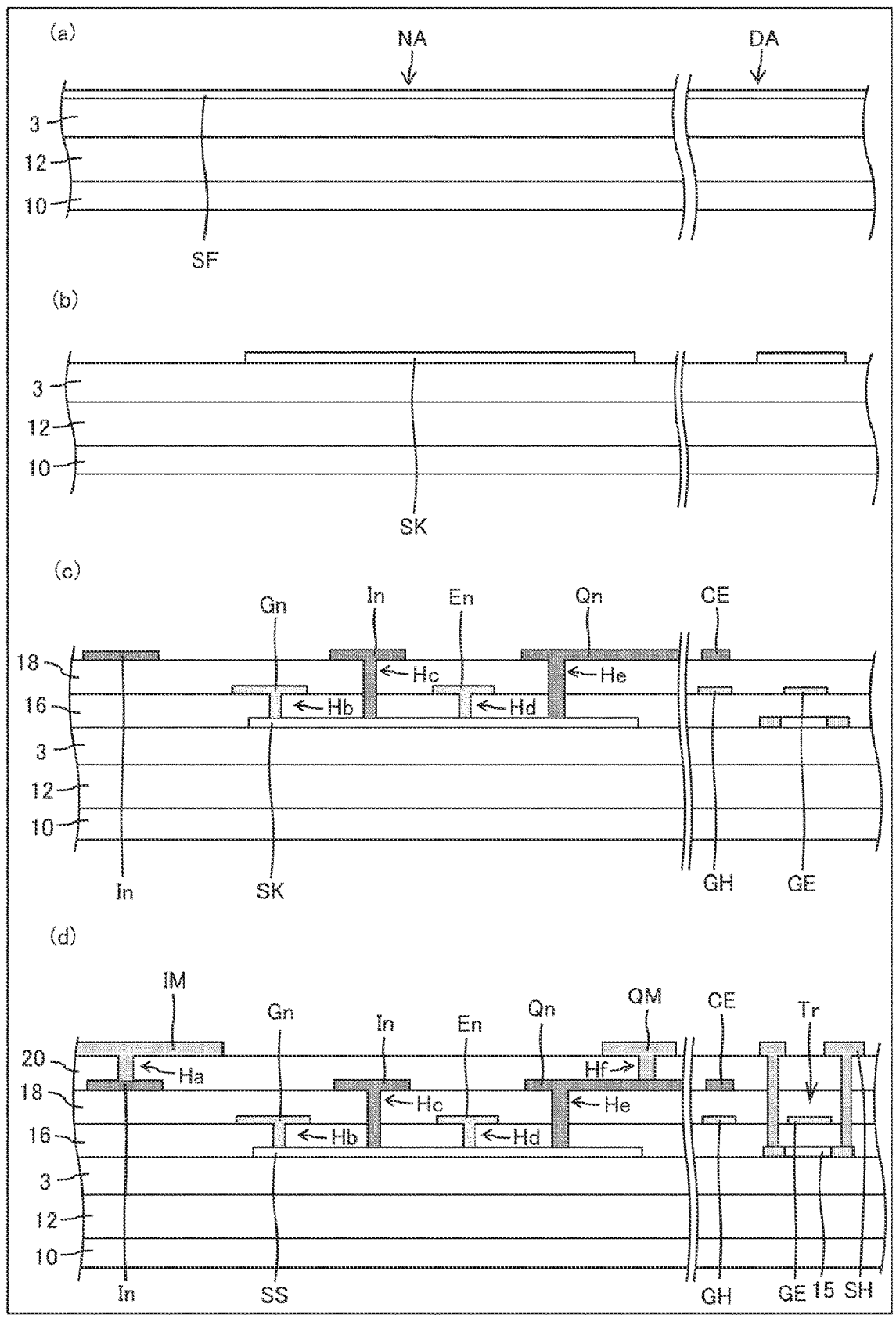
FIG. 15 is a set of manufacturing process diagrams of how semiconductor lines are formed in accordance with Embodiment 2.

FIGS. 14 and 15 show semiconductor-line-forming steps in accordance with Embodiment 2. Steps S3A to S3C in FIG. 14 form an oxide semiconductor film SF on the barrier layer 3 as shown in FIG. 15(a).

Step S3D subjects the surface of the oxide semiconductor layer to hydrogen plasma treatment, which reduces the oxide semiconductor film SF to a conductor film SK shown in FIG. 15(b). Steps S3E to S3G form the inorganic insulation film 16 (gate insulation film including an underlying silicon nitride film and an overlying silicon oxide film) covering the conductor film SK.

Steps S3H to S3J in FIG. 14 form the first metal layer containing gate lines GH, the scan signal lines Gn, and the light-emission control lines En therein. Thus, the scan signal line Gn is in contact with the conductor film SK in the contact hole Hb formed in the inorganic insulation film 16, and the light-emission control line En is in contact with the conductor film SK in the contact hole Hd formed in the inorganic insulation film 16, as shown in FIG. 15(*c*). Steps S3*k* to S3*m* form the inorganic insulation film 18 (silicon nitride film) on the first metal layer.

Steps S3*n* to S3*q* form the second metal layer containing a capacitor electrode CE, the high-voltage power supply lines Qn, and the initialization power supply lines In therein. Step S3*q* (of patterning the second metal layer) brings the initialization power supply line In into contact with the conductor film SK in the contact hole Hc formed in the inorganic insulation films 16 and 18 and brings the high-voltage power supply line Qn into contact with the conductor film SK in the contact hole He formed in the inorganic insulation films 16 and 18, as shown in FIG. 15(*c*).

Steps S3*r* to 3*u* form the inorganic insulation film 20 (silicon oxide film). Steps S3*v* to 3*x* form the third metal layer containing the first main power supply line QM and the second main power supply line IM therein. Thus, the initialization power supply line In is in contact with the second main power supply line IM in the contact hole Ha formed in the inorganic insulation film 20, and the high-voltage power supply line Qn is in contact with the first main power supply line QM in the contact hole Hf formed in the inorganic insulation film 20.

Next, step S3*y* in FIG. 14 performs annealing, which enables the silicon oxide film in the inorganic insulation film 16 (gate insulation film) to feed oxygen to the conductor film SK, that is, which oxidizes (the conductor film SK to the semiconductor line SS (oxide semiconductor) shown in FIG. 15(*d*). Step S3*z* forms the planarization film 21.

In the technology shown in FIGS. 13 to 15, prior to the formation of the third metal layer in step S3*v* in FIG. 3, step S3J electrically connects the scan signal lines Gn and the light-emission control lines En to the conductor film SK, thereby restraining the ESD-caused short-circuiting of wiring in the first metal layer (e.g., short-circuiting between the scan signal lines and the light-emission control lines).

In addition, prior to the formation of the third metal layer, step S3*q* (of patterning the second metal layer) electrically connects the initialization power supply lines In and the high-voltage power supply lines Qn to the conductor film SK, thereby restraining the ESD-caused short-circuiting of wiring in the second metal layer (e.g., short-circuiting between the initialization power supply lines and the high-voltage power supply lines) and restraining the ESD-caused short-circuiting of wiring between the first metal layer and the second metal layer (e.g., between the scan signal lines and either the initialization power supply lines or the high-voltage power supply lines and between the light-emission control lines and either the initialization power supply lines or the high-voltage power supply lines).

As shown in FIG. 13, in a plan view, the semiconductor line SS has narrowed portions WT, one each in a gap between the scan signal line Gn and the initialization power supply line In, a gap between the initialization power supply line In and the light-emission control line En, a gap between the light-emission control line En and the high-voltage power supply line Qn, and a gap between the high-voltage power supply line Qn and the scan signal line Gn+1. The line width in the narrowed portions WT is smaller than the line widths of the first main power supply line QM, the second main power supply line IM, the scan signal line Gn, the initialization power supply line In, the light-emission control line En, the high-voltage power supply line Qn, and the scan signal line Gn+1. Hence, if high static electricity occurs in any of these lines, ESD is likely to occur in one of the narrowed portions WT of the semiconductor line SS. This particular structure therefore reduces the risk of ESD-caused short-circuiting of the first main power supply line QM, the second main power supply line IM, the scan signal line Gn, the initialization power supply line In, the light-emission control line En, the high-voltage power supply line Qn, and the scan signal line Gn+1.

Figure 16:
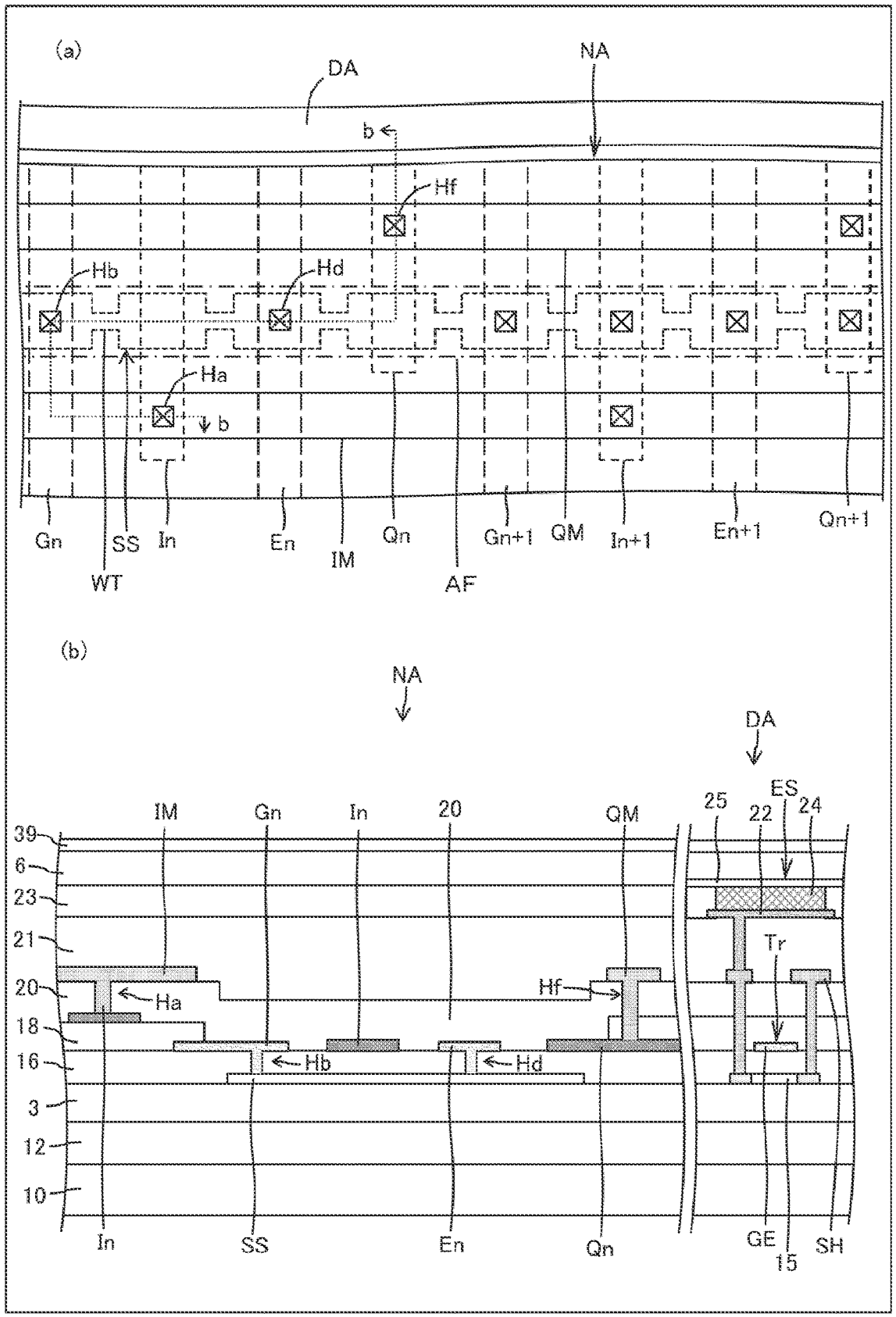
FIG. 16(a) is a plan view of another structure of the frame area and the display area in accordance with Embodiment 2.
FIG. 16(b) is a cross-sectional view taken along line b-b shown in FIG. 16(a).

As a modification to Embodiment 2, a hole may be formed through the inorganic insulation film 18 in an elongate area AF containing the semiconductor line SS therein, as shown in FIG. 16. This particular structure, in step S3*y* (annealing step) shown in FIG. 3, enables the inorganic insulation film 20 (silicon oxide film) to feed oxygen to the conductor film SK, which is a precursor to the semiconductor line SS, thereby ensuring that the conductor film SK is oxidized to the semiconductor line SS.

Figure 17:
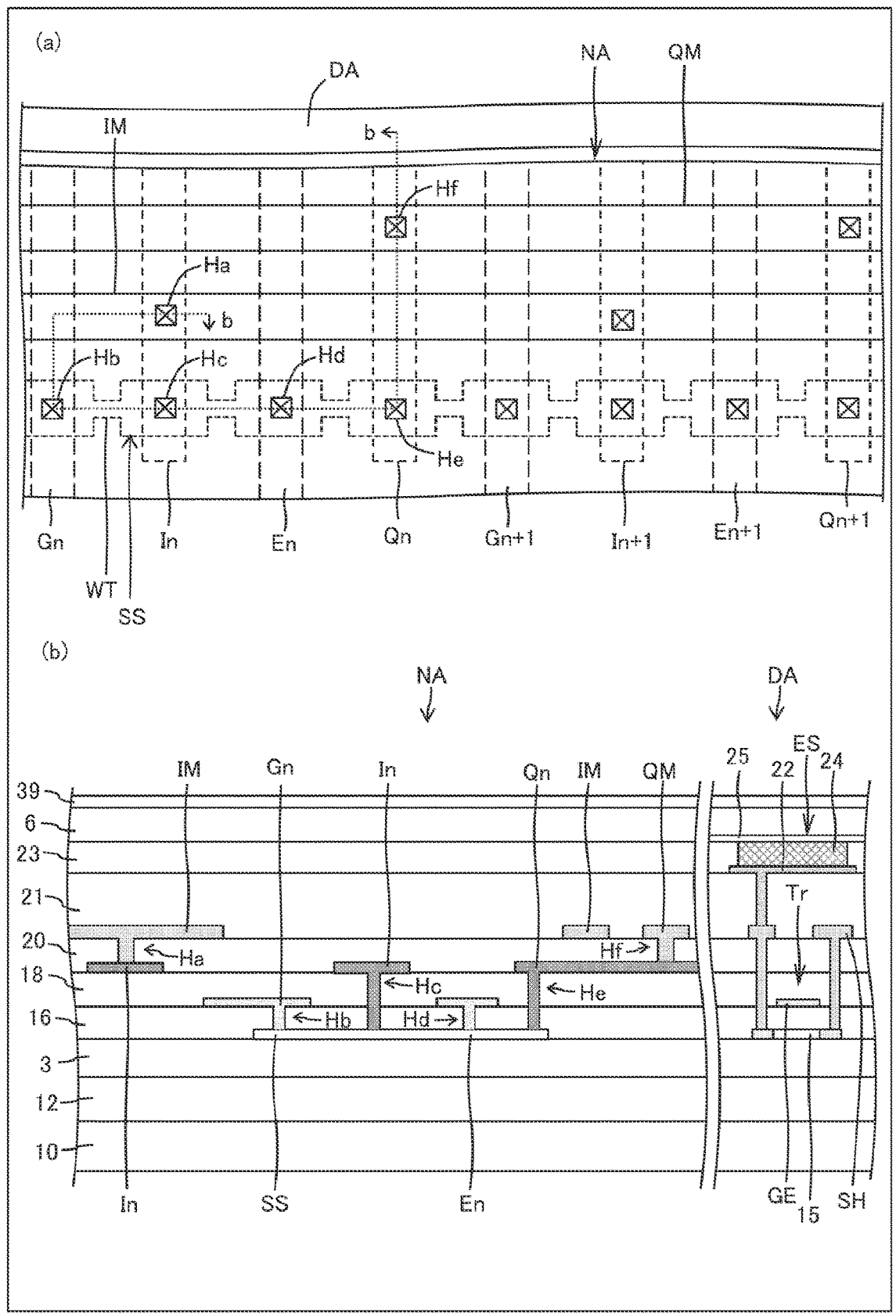
FIG. 17(a) is a plan view of yet another structure of the frame area and the display area in accordance with Embodiment 2.
FIG. 17(b) is a cross-sectional view taken along line b-b shown in FIG. 17(a).

FIG. 13 shows the semiconductor line SS being disposed in a gap between the first main power supply line QM and the second main power supply line IM both extending in the y-direction. Alternatively, as shown in FIG. 17, the semiconductor line SS may be disposed outside the first main power supply line QM and the second main power supply line IM both extending in the y-direction (i.e., closer to the driver). This particular structure reduces adverse effects of ESD, if ever, to wiring.

Figure 18:
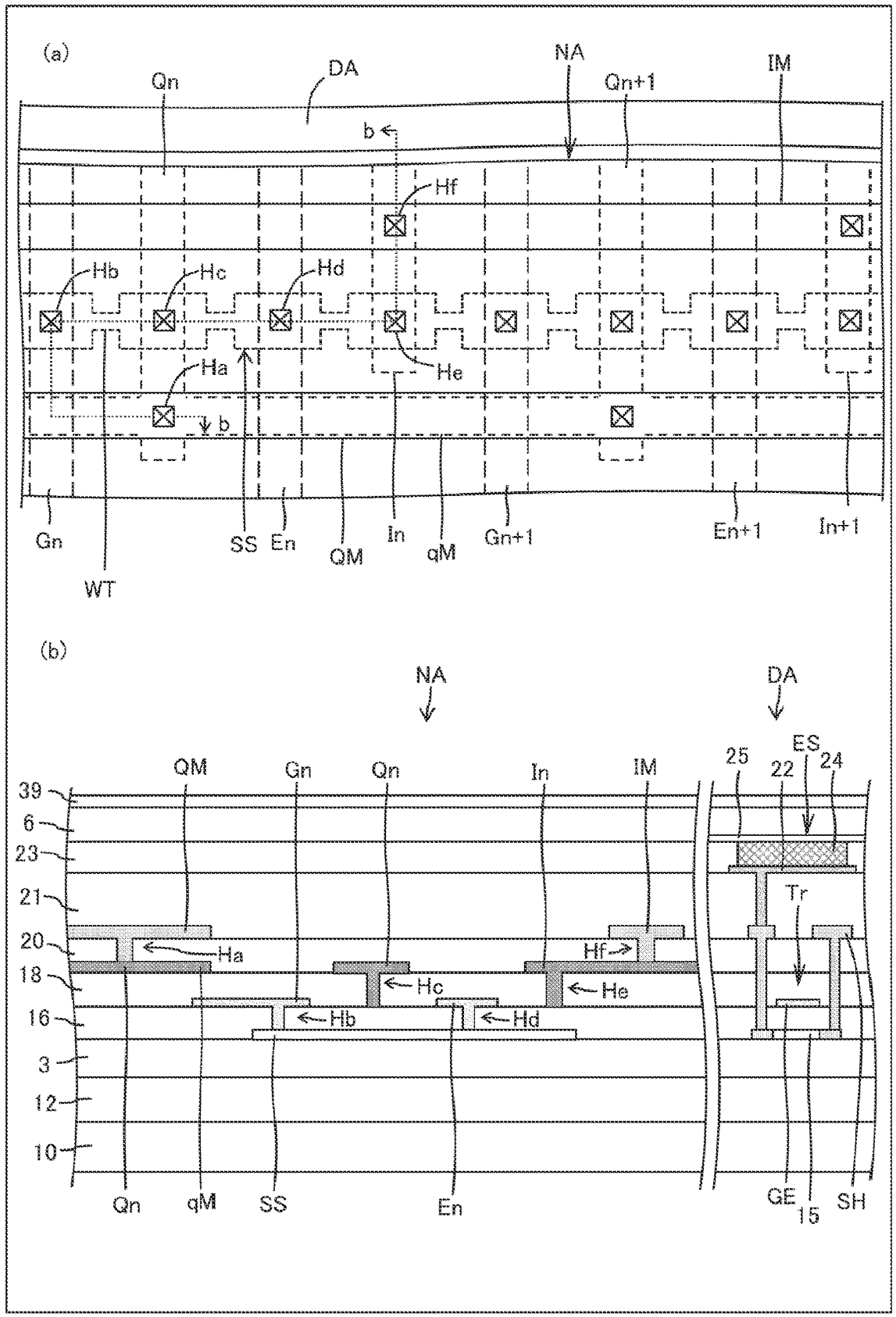
FIG. 18(*a*) is a plan view of still another structure of the frame area and the display area in accordance with Embodiment 2, and FIG. 18(*b*) is a cross-sectional view taken along line b-b shown in FIG. 18(*a*).

As another modification to Embodiment 2, there may be provided a third main power supply line qM (residing in the second metal layer) under the first main power supply line QM (residing in the third metal layer), the third main power supply line qM being connected to the high-voltage power supply lines Qn and Qn+1 in the same layer, as shown in FIG. 18.

Figure 19:
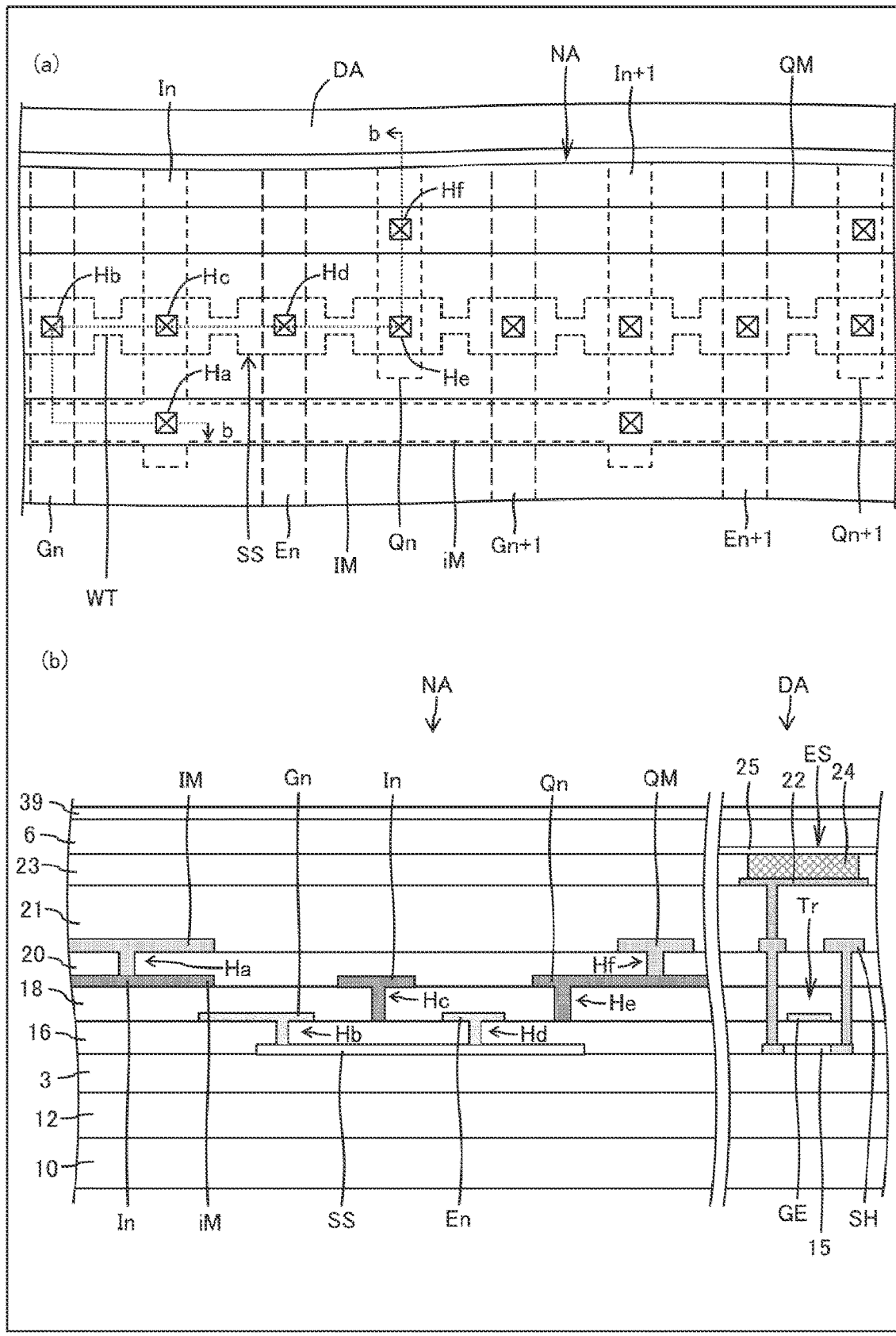
FIG. 19(*a*) is a plan view of yet still another structure of the frame area and the display area in accordance with Embodiment 2, and FIG. 19(*b*) is a cross-sectional view taken along line b-b shown in FIG. 19(*a*).

As yet another modification to Embodiment 2, there may be provided a fourth main power supply line iM (residing in the second metal layer) under the second main power supply line IM (residing in the third metal layer, the fourth main power supply line iM being connected to the initialization power supply lines In and In+1 in the same layer, as shown in FIG. 19.

Figure 20:
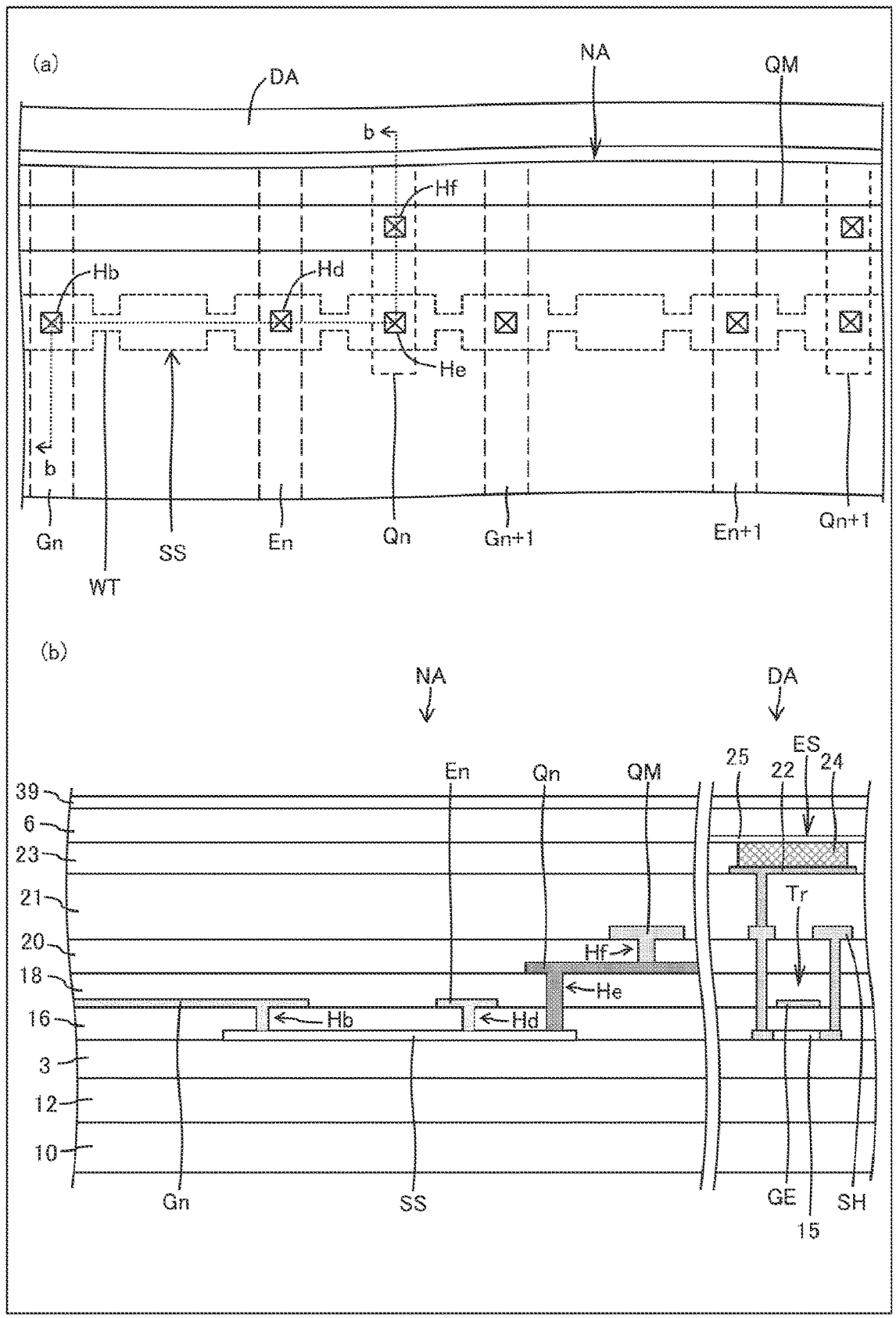
FIG. 20(*a*) is a plan view of a further structure of the frame area and the display area in accordance with Embodiment 2, and FIG. 20(*b*) is a cross-sectional view taken along line b-b shown in FIG. 20(*a*).
Figure 21:
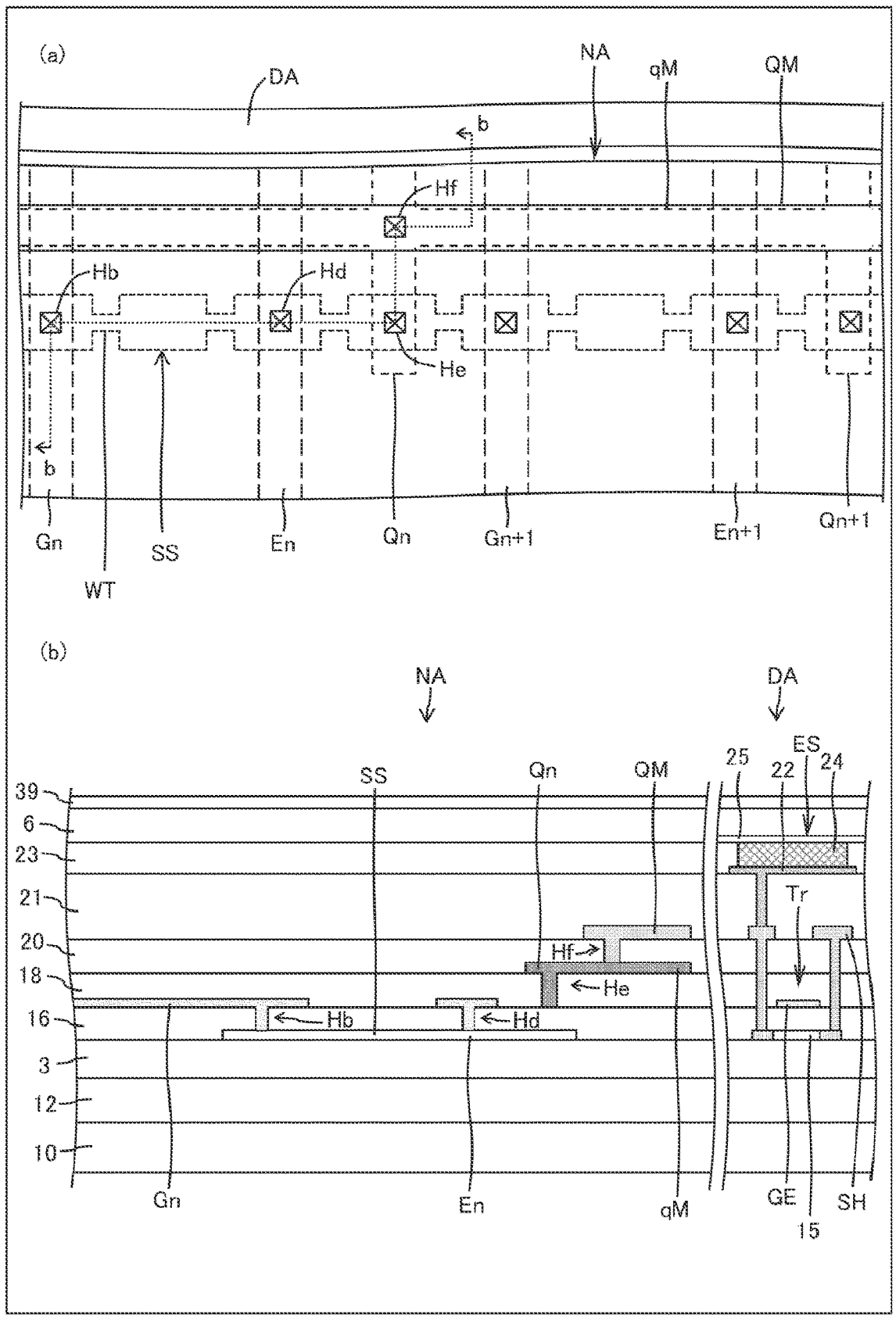
FIG. 21(*a*) is a plan view of yet a further structure of the frame area and the display area in accordance with Embodiment 2, and FIG. 21(*b*) is a cross-sectional view taken along line b-b shown in FIG. 21(*a*).

If the pixel circuit can be driven when the initialization power supply line and the high-voltage power supply line are at the same potential, the second main power supply line IM and the initialization power supply line In, among others, may be omitted as shown in FIG. 20. As a variation example of FIG. 20, there may be provided a third main power supply line qM (residing in the second metal layer) under the first main power supply line QM (residing in the third metal layer), the third main power supply line qM being connected to the high-voltage power supply lines Qn and Qn+1 in the same layer, as shown in FIG. 21.

GENERAL DESCRIPTION

Aspect 1

A display device having: a display area in which there is provided a pixel circuit; and a frame area in which there is provided a plurality of drivers, the display device including: a plurality of control lines; a plurality of power supply lines parallel to the plurality of control lines; a plurality of data signal lines crossing the plurality of control lines; an oxide semiconductor layer; a first metal layer containing the plurality of control lines therein; a gate insulation film; a first inorganic insulation film overlying the gate insulation film; a second metal layer overlying the first inorganic insulation film and containing the plurality of power supply lines therein; a second inorganic insulation film overlying the second metal layer; and a third metal layer overlying the second inorganic insulation film and containing the plurality of data signal lines therein, wherein the gate insulation film has a top face in contact with either one of the oxide semiconductor layer and the first metal layer and a bottom face in contact with another one of the oxide semiconductor layer and the first metal layer, each of the plurality of control lines is electrically connected to an associated one of the plurality of drivers via the third metal layer, the oxide semiconductor layer, in a plan view, contains therein semiconductor lines formed as islands (or isolated regions) between the plurality of drivers and the display area, and the semiconductor lines cross the plurality of control lines and the plurality of power supply lines, are in contact with the plurality of control lines via at least one opening in the gate insulation film, are in contact with the plurality of power supply lines via at least one opening in the first inorganic insulation film, and have a plurality of narrowed portions, such that there are thicker and thinner regions along the same line.

Aspect 2

The display device of, for example, aspect 1, wherein the oxide semiconductor layer is in contact with the top face of the gate insulation film.

Aspect 3

The display device of, for example, aspect 1, wherein the oxide semiconductor layer is in contact with the bottom face of the gate insulation film.

Aspect 4

The display device of, for example, aspect 1, wherein the gate insulation film contains silicon oxide, the first inorganic insulation film contains silicon nitride, and the second inorganic insulation film contains silicon oxide.

Aspect 5

The display device of, for example, any one of aspects 1 to 4, wherein the plurality of control lines includes a light-emission control line and a scan signal line that are adjacent to each other, and at least one of the plurality of narrowed portions, in a plan view, resides between the light-emission control line and the scan signal line.

Aspect 6

The display device of, for example, any one of aspects 1 to 5, wherein at least one of the plurality of narrowed portions, in a plan view, resides between one of the plurality of control lines and one of the plurality of power supply lines.

Aspect 7

The display device of, for example, any one of aspects 1 to 6, wherein each of the plurality of power supply lines and each of the semiconductor lines overlap in a region in which that power supply line and that semiconductor line overlap none of the plurality of control lines.

Aspect 8

The display device of, for example, any one of aspects 1 to 7, wherein the plurality of power supply lines includes a high-voltage power supply line, the third metal layer contains a first main power supply line therein, and the high-voltage power supply line, in a plan view, crosses the first main power supply line between the display area and the semiconductor lines and is electrically connected to the first main power supply line via a contact hole formed in the second inorganic insulation film.

Aspect 9

The display device of, for example, any one of aspects 1 to 7, wherein the plurality of power supply lines includes an initialization power supply line, the third metal layer contains a second main power supply line therein, and the initialization power supply line, in a plan view, crosses the second main power supply line between the display area and the semiconductor lines and is electrically connected to the second main power supply line via a contact hole formed in the second inorganic insulation film.

Aspect 10

The display device of, for example, any one of aspects 1 to 7, wherein the plurality of power supply lines includes a high-voltage power supply line and an initialization power supply line, the third metal layer contains a first main power supply line and a second main power supply line therein, the second metal layer contains a third main power supply line therein, the high-voltage power supply line, in a plan view, crosses the first main power supply line between the plurality of drivers and the semiconductor lines and is electrically connected to the first main power supply line via a contact hole formed in the second inorganic insulation film, the third main power supply line, in a plan view, resides between the plurality of drivers and the semiconductor lines, the high-voltage power supply line, in a plan view, branches out from the third main power supply line and extends toward a display area side, and the initialization power supply line, in a plan view, crosses the second main power supply line between the display area and the semiconductor lines and is electrically connected to the second main power supply line via a contact hole formed in the second inorganic insulation film.

Aspect 11

The display device of, for example, any one of aspects 1 to 7, wherein the plurality of power supply lines includes a high-voltage power supply line and an initialization power supply line, the third metal layer contains a first main power supply line and a second main power supply line therein, the second metal layer contains a fourth main power supply line therein, the high-voltage power supply line, in a plan view, crosses the first main power supply line between the display area and the semiconductor lines and is electrically connected to the first main power supply line via a contact hole formed in the second inorganic insulation film, the initialization power supply line, in a plan view, crosses the second main power supply line between the plurality of drivers and the semiconductor lines and is electrically connected to the second main power supply line via a contact hole formed in the second inorganic insulation film, the fourth main power supply line, in a plan view, resides between the plurality of drivers and the semiconductor lines, and the initialization power supply line, in a plan view, branches out from the fourth main power supply line and extends toward a display area side.

Aspect 12

The display device of, for example, any one of aspects 1 to 7, wherein the plurality of power supply lines includes a high-voltage power supply line, the third metal layer contains a first main power supply line therein, the second metal layer contains a third main power supply line therein, the high-voltage power supply line, in a plan view, crosses the first main power supply line between the display area and the semiconductor lines and is electrically connected to the first main power supply line via a contact hole formed in the second inorganic insulation film, the third main power supply line, in a plan view, resides between the plurality of drivers and the semiconductor lines, and the high-voltage power supply line, in a plan view, branches out from the third main power supply line and extends toward a display area side.

Aspect 13

The display device of, for example, aspect 2, wherein the first inorganic insulation film is a nitride film, the second inorganic insulation film is an oxide film, and the first inorganic insulation film has a slit in which the semiconductor lines are exposed.

Aspect 14

The display device of, for example, any one of aspects 1 to 13, wherein the pixel circuit includes a capacitor having an electrode in the first metal layer and another electrode in the second metal layer.

Aspect 15

The display device of, for example, aspect 14, wherein the other electrode is electrically connected to a high-voltage power supply line that is one of the plurality of power supply lines.

Aspect 16

The display device of, for example, any one of aspects 1 to 15, wherein the pixel circuit includes a transistor including a semiconductor film as a channel in the oxide semiconductor layer and a gate electrode in the first metal layer.

Aspect 17

A display device having: a display area in which there is provided a pixel circuit; and a frame area, the display device including: a plurality of wires in the display area and the frame area; a semiconductor line in the frame area, the semiconductor line being made of an oxide semiconductor and residing in a same layer as a channel of a transistor in the pixel circuit; and an inorganic insulation film, wherein the semiconductor line is in contact with the plurality of wires via a plurality of openings in the inorganic insulation film and has a narrowed portion, such that there is thicker and thinner regions along the same line, formed so as not to overlap the plurality of wires.

The invention claimed is:

1. A display device having: a display area in which there is provided a pixel circuit; and a frame area in which there is provided a plurality of drivers, the display device comprising:
   a plurality of control lines;
   a plurality of power supply lines parallel to the plurality of control lines;
   a plurality of data signal lines crossing the plurality of control lines;
   an oxide semiconductor layer;
   a first metal layer containing the plurality of control lines therein;
   a gate insulation film;
   a first inorganic insulation film overlying the gate insulation film;
   a second metal layer overlying the first inorganic insulation film and containing the plurality of power supply lines therein;
   a second inorganic insulation film overlying the second metal layer; and
   a third metal layer overlying the second inorganic insulation film and containing the plurality of data signal lines therein, wherein
   the gate insulation film has a top face in contact with either one of the oxide semiconductor layer and the first metal layer and a bottom face in contact with another one of the oxide semiconductor layer and the first metal layer,
   each of the plurality of control lines is electrically connected to an associated one of the plurality of drivers via the third metal layer,
   the oxide semiconductor layer, in a plan view, contains therein semiconductor lines formed as isolated regions between the plurality of drivers and the display area, and
   the semiconductor lines cross the plurality of control lines and the plurality of power supply lines, are in contact with the plurality of control lines via at least one opening in the gate insulation film, are in contact with the plurality of power supply lines via at least one opening in the first inorganic insulation film, and have a plurality of narrowed portions, such that thicker and thinner regions exist along the same line.

2. The display device according to claim 1, wherein the oxide semiconductor layer is in contact with the top face of the gate insulation film.

3. The display device according to claim 1, wherein the oxide semiconductor layer is in contact with the bottom face of the gate insulation film.

4. The display device according to claim 1, wherein
   the gate insulation film contains silicon oxide,
   the first inorganic insulation film contains silicon nitride, and
   the second inorganic insulation film contains silicon oxide.

5. The display device according to claim 1, wherein
   the plurality of control lines includes a light-emission control line and a scan signal line that are adjacent to each other, and
   at least one of the plurality of narrowed portions, in a plan view, resides between the light-emission control line and the scan signal line.

6. The display device according to claim 1, wherein at least one of the plurality of narrowed portions, in a plan view, resides between one of the plurality of control lines and one of the plurality of power supply lines.

7. The display device according to claim 1, wherein each of the plurality of power supply lines and each of the semiconductor lines overlap in a region in which the plurality of power supply lines and the semiconductor lines overlap none of the plurality of control lines.

8. The display device according to claim 1, wherein
   the plurality of power supply lines includes a high-voltage power supply line,
   the third metal layer contains a first main power supply line therein, and
   the high-voltage power supply line, in a plan view, crosses the first main power supply line between the display area and the semiconductor lines and is electrically connected to the first main power supply line via a contact hole formed in the second inorganic insulation film.

9. The display device according to claim 1, wherein
   the plurality of power supply lines includes an initialization power supply line,
   the third metal layer contains a second main power supply line therein, and
   the initialization power supply line, in a plan view, crosses the second main power supply line between the display area and the semiconductor lines and is electrically connected to the second main power supply line via a contact hole formed in the second inorganic insulation film.

10. The display device according to claim 1, wherein
   the plurality of power supply lines includes a high-voltage power supply line and an initialization power supply line, the third metal layer contains a first main power supply line and a second main power supply line therein, the second metal layer contains a third main power supply line therein, the high-voltage power supply line, in a plan view, crosses the first main power supply line between the plurality of drivers and the semiconductor lines and is electrically connected to the first main power supply line via a contact hole formed in the second inorganic insulation film, the third main power supply line, in a plan view, resides between the plurality of drivers and the semiconductor lines, the high-voltage power supply line, in a plan view, branches out from the third main power supply line and extends toward a display area side, and the initialization power supply line, in a plan view, crosses the second main power supply line between the display area and the semiconductor lines and is electrically connected to the second main power supply line via a contact hole formed in the second inorganic insulation film.

11. The display device according to claim 1, wherein the plurality of power supply lines includes a high-voltage power supply line and an initialization power supply line, the third metal layer contains a first main power supply line and a second main power supply line therein, the second metal layer contains a fourth main power supply line therein, the high-voltage power supply line, in a plan view, crosses the first main power supply line between the display area and the semiconductor lines and is electrically connected to the first main power supply line via a contact hole formed in the second inorganic insulation film, the initialization power supply line, in a plan view, crosses the second main power supply line between the plurality of drivers and the semiconductor lines and is electrically connected to the second main power supply line via a contact hole formed in the second inorganic insulation film, the fourth main power supply line, in a plan view, resides between the plurality of drivers and the semiconductor lines, and the initialization power supply line, in a plan view, branches out from the fourth main power supply line and extends toward a display area side.

12. The display device according to claim 1, wherein the plurality of power supply lines includes a high-voltage power supply line, the third metal layer contains a first main power supply line therein, the second metal layer contains a third main power supply line therein, the high-voltage power supply line, in a plan view, crosses the first main power supply line between the display area and the semiconductor lines and is electrically connected to the first main power supply line via a contact hole formed in the second inorganic insulation film, the third main power supply line, in a plan view, resides between the plurality of drivers and the semiconductor lines, and the high-voltage power supply line, in a plan view, branches out from the third main power supply line and extends toward a display area side.

13. The display device according to claim 2, wherein the first inorganic insulation film is a nitride film, the second inorganic insulation film is an oxide film, and the first inorganic insulation film has a slit in which the semiconductor lines are exposed.

14. The display device according to claim 1, wherein the pixel circuit includes a capacitor having an electrode in the first metal layer and another electrode in the second metal layer.

15. The display device according to claim 14, wherein the other electrode is electrically connected to a high-voltage power supply line that is one of the plurality of power supply lines.

16. The display device according to claim 1, wherein the pixel circuit includes a transistor including a semiconductor film as a channel in the oxide semiconductor layer and a gate electrode in the first metal layer.

17. A display device having: a display area in which there is provided a pixel circuit; and a frame area, the display device comprising:

a plurality of wires in the display area and the frame area;

a semiconductor line in the frame area, the semiconductor line being made of an oxide semiconductor and residing in a same layer as a channel of a transistor in the pixel circuit; and an inorganic insulation film, wherein the semiconductor line is in contact with the plurality of wires via a plurality of openings in the inorganic insulation film and has a narrowed portion, such that thicker and thinner regions exist along the same line, formed so as not to overlap the plurality of wires.

* * * * *